United States Patent
Abe

(10) Patent No.: US 7,276,187 B2
(45) Date of Patent: Oct. 2, 2007

(54) TRANSPARENT CONDUCTIVE THIN FILM, PROCESS FOR PRODUCING THE SAME, SINTERED TARGET FOR PRODUCING THE SAME, AND TRANSPARENT, ELECTROCONDUCTIVE SUBSTRATE FOR DISPLAY PANEL, AND ORGANIC ELECTROLUMINISCENCE DEVICE

(75) Inventor: Yoshiyuki Abe, Ichikawa (JP)

(73) Assignee: Sumitomo Metal Mining Co., Ltd., Tokyo (JP)

(*) Notice: Subject to any disclaimer, the term of this patent is extended or adjusted under 35 U.S.C. 154(b) by 0 days.

(21) Appl. No.: 11/447,873

(22) Filed: Jun. 7, 2006

(65) Prior Publication Data

US 2006/0284143 A1   Dec. 21, 2006

Related U.S. Application Data

(62) Division of application No. 11/124,296, filed on May 9, 2005, now Pat. No. 7,125,503, which is a division of application No. 10/397,831, filed on Mar. 27, 2003, now Pat. No. 6,911,163.

(30) Foreign Application Priority Data

| Mar. 27, 2002 | (JP) | ............................... 2002-87360 |
| Jul. 5, 2002 | (JP) | ............................. 2002-196840 |
| Nov. 20, 2002 | (JP) | ............................. 2002-337130 |
| Dec. 4, 2002 | (JP) | ............................. 2002-353011 |

(51) Int. Cl.
*H01B 1/08* (2006.01)
*C23C 14/08* (2006.01)

(52) U.S. Cl. ............................... 252/520.5; 252/521.3; 204/192.15

(58) Field of Classification Search ............. 252/521.3; 428/411.1; 75/232; 204/192.1, 192.15
See application file for complete search history.

(56) References Cited

U.S. PATENT DOCUMENTS 5,225,273 A * 7/1993 Mikoshiba et al. ......... 428/323
7,011,691 B2 * 3/2006 Abe ............................ 75/232

FOREIGN PATENT DOCUMENTS

JP    62-202415 A    9/1987

(Continued)

OTHER PUBLICATIONS

Toshiro Maruyama, et al., *Germanium-and Silicon-doped Indium-oxide Thin Films Prepared by Radio-frequency Magnetron Sputtering*, Appl. Phys. Lett., vol. 64, No. 11, Mar. 14, 1994, pp. 1395-1397.

*Primary Examiner*—Mark Kopec
(74) *Attorney, Agent, or Firm*—Westerman, Hattori, Daniels & Adrian, LLP.

(57) ABSTRACT

A transparent conductive thin film which can be produced easily by sputtering or the like with a sintered target, needs no post-treatment such as etching or grinding, is low in resistance and excellent in surface smoothness, and has a high transmittance in the low-wavelength region of visible rays; and transparent, electroconductive substrate for a display panel and an organic electroluminescence device excellent in light-emitting characteristics, both including the transparent conductive thin film. More particularly, a transparent conductive thin film comprising indium oxide as the major component and silicon as a dopant, having a substantially amorphous structure, wherein silicon is incorporated at 0.5 to 13% by atom on indium and silicon totaled; and a transparent conductive thin film comprising indium oxide as the major component and tungsten and germanium, wherein tungsten is incorporated at a W/In atomic ratio of 0.003 to 0.047 and germanium is incorporated at a Ge/In atomic ratio of 0.001 to 0.190.

5 Claims, 4 Drawing Sheets

FOREIGN PATENT DOCUMENTS

| | | |
|---|---|---|
| JP | 3-64450 A | 3/1991 |
| JP | 4-48516 A | 2/1992 |
| JP | 6-234521 A | 8/1994 |
| JP | 10-162959 A | 6/1998 |
| JP | 11-323531 A | 11/1999 |
| JP | 2000-144393 A | 5/2000 |
| JP | 2001-43980 A | 2/2001 |
| JP | 2004-050643 A2 | 2/2004 |

* cited by examiner

TRANSPARENT CONDUCTIVE THIN FILM, PROCESS FOR PRODUCING THE SAME, SINTERED TARGET FOR PRODUCING THE SAME, AND TRANSPARENT, ELECTROCONDUCTIVE SUBSTRATE FOR DISPLAY PANEL, AND ORGANIC ELECTROLUMINISCENCE DEVICE This application is a divisional of prior application Ser. No. 11/124,296 (filed on May 9, 2005, now U.S. Pat. No. 7,125,503) which is a divisional application of prior application Ser. No. 10/397,831 (filed on Mar. 27, 2003, now U.S. Pat. No. 6,911,163), the benefit of which is claimed under 35 U.S.C. §120.

BACKGROUND OF THE INVENTION

1. Field of the Invention

The present invention relates to a transparent conductive thin film, process for producing the same, sintered target for producing the same, and transparent, electroconductive substrate for display panels and organic electroluminescence devices, more particularly a transparent conductive thin film which can be produced easily by sputtering or the like with a sintered target, needs no post-treatment such as etching or grinding, is low in resistance and excellent in surface smoothness, and has a high transmittance in the low-wavelength region of visible rays; and transparent, electroconductive substrate for display panel and organic electroluminescence device excellent in light-emitting characteristics, both including the transparent conductive thin film.

2. Description of the Prior Art

A transparent conductive thin film has a high electroconductivity and high transmittance in the visible light region. Therefore, it has been widely used as a transparent electrode for various devices, e.g., solar cells, liquid-crystal displays (LCDs), display panels with an electroluminescence device, and various types of light-receiving devices.

It has been also used for heat ray reflecting films for windows of automobiles, buildings or the like, various types of antistatic films, and transparent heating devices for antifogging purposes for showcases containing frozen foods.

An electroluminescence device (hereinafter referred to as EL device) is a device that utilizes electroluminescence, and has been attracting much attention as a light-emitting device for various types of displays, because of its high visibility and resistance to impact, the former coming from its self-luminescence and the latter from being completely solid. EL devices fall into two general categories of inorganic and organic devices, the former using an inorganic compound as the light-emitting material and the latter an organic compound. Organic EL devices have been extensively studied for commercialization of displays of the next generation, because they can be easily made compact by greatly reducing the driving voltage. An organic EL device is composed of a laminate of anode/light-emitting layer/cathode as the basic structure with a transparent conductive thin film as the anode formed on a transparent, electrically insulating substrate, e.g., glass sheet, where light is normally emitted from the substrate side.

Various materials have been extensively used for transparent conductive thin films. They include tin oxide ($SnO_2$) doped with antimony or fluorine, zinc oxide (ZnO) doped with aluminum or gallium, and indium oxide ($In_2O_3$) doped with tin. In particular, films of indium oxide ($In_2O_3$) doped with tin, or $In_2O_3$—Sn-based films referred to as ITO (indium tin oxide) films, have been widely used because of easiness of producing low-resistance films.

The known processes for producing thin ITO films include spraying, vacuum evaporation, sputtering and ion plating. Sputtering is an effective process for forming a film of a compound of low vapor pressure on an object (hereinafter merely referred to as substrate), or forming a film whose thickness should be precisely controlled. It has been widely used because it can be handled by a simple procedure. Ion plating is a process that ionizes the particles evaporated in a manner similar to that for sputtering to improve their adhesive strength to the substrate, and then accelerates them in an electrical field onto the substrate, on which the film is securely formed.

Of these processes, sputtering is a film-making process which generates an argon plasma by a glow discharge produced between the substrate as the anode and a target as the cathode in an inert atmosphere (argon) kept at 0.1 to 10 Pa, and directs the resulting argon cations onto the target as the cathode to scatter the target component particles out of the cathode, which are deposited on the substrate.

This process is classified by method for producing the argon plasma; radio-frequency (RF) sputtering when radio-frequency (RF) plasma is used, and DC sputtering when DC plasma is used. The film can be produced by focusing argon plasma on immediately above the target by a magnet provided on the backside of the target. This method is magnetron sputtering, which can have high argon ion collision efficiency even at low gas pressure. DC magnetron sputtering is normally adopted to produce transparent conductive thin films of ITO.

Sintered ITO is normally used as the target. It is produced by a powder sintering process, in which indium oxide or tin oxide is incorporated to have a substantially intended composition, pressed and sintered at 1400° C. or higher.

The target is normally of sintered ITO containing tin oxide ($SnO_2$) at around 10% by weight, in particular the one having a density below 7.0 g/cm$^3$. More recently, sintered ITO of higher density and the target using such a sinter are being developed to improve film-making characteristics of ITO.

A process for producing sintered ITO of high density (density: 7.02 g/cm$^3$ or more, or 98% or more as relative density) and high uniformity (scattering of around 1%) is disclosed by Japanese Patent Laid-open Publication No. 2000-144393. Sputtering with this ITO target gives good films during the initial stage, but deteriorates in sputtering performance (sputter rate) as the process time nears the final stage, because a black substance called nodule is generated on the target surface to cause problems, e.g., abnormal discharge. This phenomenon results from uncontrolled pore distribution in the sinter. This means that its effects cannot be negligible, when sputtering lasts a long time.

The electrode for LCDs and organic EL devices needs a transparent conductive thin film of surface smoothness and low resistance. In particular, an electrode for displays with an organic EL device needs a transparent conductive thin film of a highly smooth surface, because a superthin film of organic compound is formed thereon. Surface smoothness generally depends greatly on crystallinity of the film, and an amorphous film free of grain boundaries has a better surface smoothness than the others of the same composition.

Even the ITO film of conventional composition is amorphous and has good surface smoothness, when formed by evaporation on a substrate kept at a low temperature (e.g., to 150° C. or lower) during the film-making process. However, the film prepared by evaporation is insufficient in density and adhesion to the substrate, and it is also insufficient in film stability and repeatability. Therefore, it is not suitable for mass production of transparent conductive thin films. On the other hand, sputtering is expected to give a film of excellent surface smoothness, when effected without heating the substrate during the film-making process and at a high sputtering gas pressure (e.g., 2 Pa or more), because the film tends to be amorphous.

However, resistivity of the amorphous ITO film thus prepared is limited to $6 \times 10^{-4}$ to $8 \times 10^{-4}$ $\Omega \cdot cm$. Therefore, it should have a sufficient thickness to form an electrode of low surface resistance to be useful for displays e.g., LCDs and organic EL devices. However, the ITO film may have a problem of coloration when its thickness exceeds 500 nm.

The ITO film, even when prepared by sputtering without heating the substrate, may be locally heated, because of high kinetic energy of the sputtered grains incident on the substrate, to form the mixed film of the amorphous phase contaminated with the fine crystalline phase. This tendency is more noted as sputtering gas pressure decreases.

The fine crystalline phase present in the ITO film can be detected by a transmission electron microscope, in addition to X-ray diffractometer. It can deteriorate surface smoothness of the film, even when produced only locally. Moreover, it may cause problems related to post-treatment, because it may selectively remain unremoved by etching with a weak acid, which is a necessary post-treatment step to remove fine projections on the surface for surface smoothness.

Some processes for stably producing completely amorphous ITO films have been proposed. For example, Japanese Patent Laid-open Publication No. 4-48516 discloses a process for producing an amorphous ITO film by sputtering the target while keeping the substrate at 100 to 120° C., which is lower than crystallization temperature of ITO (around 150° C.). Japanese Patent Laid-open Publication No. 3-64450 discloses a film-making process with hydrogen gas introduced into the oxygen-containing inert gas for sputtering.

However, the ITO film prepared at low temperature, although easily patterned by wet etching because it is amorphous, involves problems of increased electrical resistivity and decreased visible rays transmittance. The process that includes photolithography for etching the amorphous ITO film formed on a substrate with hydrogen gas introduced in the sputtering step and annealing for crystallization of the film cannot form the amorphous film at a sufficiently high film-making rate. The complicated process is another disadvantage.

Japanese Patent Laid-open Publication No. 62-202415 discloses a process for producing an indium oxide film doped with silicon or silicon and tin by RF sputtering or electron beam evaporation. This process can produce an indium oxide film doped with silicon or silicon and tin free of film defects, but the publication is silent on crystalline structure of the film, from which it is considered that it cannot give a film of surface smoothness even when it is prepared by RF sputtering in a pure argon gas atmosphere.

A Si-doped indium oxide film is totally crystalline, as observed by X-ray diffractometry, so it is not excepted to be an amorphous film that is excellent in surface smoothness (refer to Appl. Phys. Let., vol. 64, 1994, p. 1395).

An $In_2O_3$—ZnO-based film is known as a transparent, electroconductive film that is amorphous and excellent in surface smoothness, as disclosed by, e.g., Japanese Patent Laid-open Publication No. 6-234521. This film can keep its properties even when exposed to heat of 200° C., but it has a lower transmittance than that of an ITO film in the low wavelength region of visible rays, because it contains metallic Zn. However, it may have the problem of unstable properties, because it is known that metallic Zn or ZnO present in the film tends to react with carbon dioxide and moisture in air. Therefore, an $In_2O_3$—ZnO-based film is functionally insufficient for an LCD or organic EL device electrode.

Japanese Patent Laid-open Publication No. 11-323531 discloses a transparent conductive thin film of an amorphous In—Ge-based material. However, it has a high electrical resistivity of $8 \times 10^{-4}$ $\Omega \cdot cm$ or more, and is unsuitable for an LCD or organic EL device electrode.

More recently, an attempt has been made to use a transparent cathode for an EL device and to emit light from the cathode side. A light-receiving device transparent as a whole can be made when both anode and cathode are made transparent. The transparent light-emitting device can perform colorful display while it is not emitting light, when an optional color is used as a background color, to improve its decorative characteristics. For example, when black color is used as the background color, the device can have improved contrast while it is emitting light. The EL device can be provided with a color filter or color conversion layer as an accessory without considering the accessory while it is produced, because the accessory can be placed on the light-emitting device. This provides the advantage of reducing electrode resistance, because it can be produced while increasing substrate temperature.

Under these situations, an attempt has been made recently to produce an organic EL device with a transparent cathode. For example, Japanese Patent Laid-open Publication No. 10-162959 discloses an organic EL device having a structure with an electron-injecting metallic layer coming into contact with the organic layer by placing the organic layer containing an organic light-emitting layer between the anode and cathode, the latter being composed of the electron-injecting metallic layer and amorphous, transparent, electroconductive layer. Japanese Patent Laid-open Publication No. 2001-43980 discloses an organic EL device with a transparent cathode and light-reflecting metallic layer, e.g., that of Cr, Mo, W, Ta or Nb, for the anode so that it can emit light more efficiently from the cathode.

However, each of these EL devices, containing an $In_2O_3$—ZnO-based film as the transparent conductive thin film, has the problems of lower transmittance than an ITO film in the low wavelength region of visible rays, as discussed earlier, and unstable characteristics.

A transparent conductive thin film very high in surface smoothness, low in resistance and high in transmittance is an essential part for various display panels, e.g., LCDs and organic EL devices, which are recently becoming increasingly more precise and fine. Therefore, there is a large demand for easy processes capable of producing a transparent conductive thin film high in surface smoothness, low in resistance and high in transmittance.

SUMMARY OF THE INVENTION

It is an object of the present invention to provide a thin, transparent, electroconductive thin film which can be produced easily by sputtering or the like with a sintered target, needs no post-treatment such as etching or grinding, is low in resistance and excellent in surface smoothness, and has a high transmittance in the low-wavelength region of visible rays, in consideration of the above-described problems involved in the conventional techniques. It is another object of the present invention to provide a process for producing the same. It is still another object of the present invention to provide a sintered target for producing the same. It is still another object of the present invention to provide a transparent, electroconductive substrate for display panels and or organic electroluminescence devices, both including the transparent conductive thin film.

Means for Solving the Problems

The inventors of the present invention have found, after having extensively studied to solve the above problems by preparing transparent conductive thin films of varying composition by sputtering and examining their crystalline structures, electric and optical characteristics in detail, that a transparent conductive thin film comprising indium oxide as the major component and silicon, indium oxide as the major component and tungsten and silicon, or indium oxide as the major component and tungsten and germanium, is useful for a transparent electrode film for organic EL devices and LCDs, when prepared under specific conditions, because it is amorphous, and hence has excellent surface smoothness, and has low electrical resistance and high transmittance of visible rays, achieving the present invention.

The first aspect of the present invention is a transparent conductive thin film comprising indium oxide as the major component and silicon, having a substantially amorphous structure, wherein silicon is incorporated at 0.5 to 13% by atom on indium and silicon totaled.

The second aspect of the present invention is the transparent conductive thin film of the first aspect, wherein at least one type of dopant selected from the group consisting of tin and tungsten is incorporated.

The third aspect of the present invention is the transparent conductive thin film of the second aspect, wherein tin is incorporated at 0.5 to 15% by atom on tin and indium totaled.

The fourth aspect of the present invention is the transparent conductive thin film of the second aspect, wherein tungsten is incorporated at 0.2 to 15% by atom on tungsten and indium totaled.

The fifth aspect of the present invention is the transparent conductive thin film of one of the first to fourth aspects that has a resistivity of $9.0 \times 10^{-4}$ Ω·cm or less.

The sixth aspect of the present invention is the transparent conductive thin film of one of the first to fifth aspects that has an average centerline surface roughness (Ra) of 2.5 nm or less.

The seventh aspect of the present invention is the transparent conductive thin film of one of the first to sixth aspects which has an average transmittance of visible rays (400 to 800 nm) of 85% or more.

The eighth aspect of the present invention is the transparent conductive thin film of one of the first to seventh aspects which has a crystallization temperature of 180° C. or higher.

The ninth aspect of the present invention is a transparent conductive thin film comprising indium oxide as the major component and tungsten and germanium, wherein tungsten is incorporated at a W/In atomic ratio of 0.003 to 0.047 and germanium is incorporated at a Ge/In atomic ratio of 0.001 to 0.190.

The tenth aspect of the present invention is the transparent conductive thin film of the ninth aspect, wherein tungsten is incorporated at a W/In atomic ratio of 0.005 to 0.026 and germanium is incorporated at a Ge/In atomic ratio of 0.033 to 0.190.

The 11th aspect of the present invention is the transparent conductive thin film of ninth aspect that has a resistivity of $8.0 \times 10^{-4}$ Ω·cm or less.

The 12th aspect of the present invention is the transparent conductive thin film of the 11th aspect that has a resistivity of $4.0 \times 10^{-4}$ Ω·cm or less.

The 13th aspect of the present invention is the transparent conductive thin film of ninth aspect, wherein the thin film structure is substantially amorphous, as determined by X-ray diffractometry.

The 14th aspect of the present invention is the transparent conductive thin film of ninth aspect which has a crystallization temperature of 180° C. or higher.

The 15th aspect of the present invention is the transparent conductive thin film of ninth aspect that has a surface roughness (Ra) of 1.5 nm or less.

The 16th aspect of the present invention is a sintered target for producing the transparent conductive thin film of one of the first to eighth aspects, wherein a plurality of silicon chips are put up, at almost the same intervals, on a sintered target selected from the group consisting of sintered indium oxide, indium oxide doped with tin and indium oxide doped with tungsten.

The 17th aspect of the present invention is a sintered target for producing the transparent conductive thin film of one of the first to eighth aspects, wherein the sintered target is selected from the group consisting of sintered indium oxide doped with silicon, and indium oxide doped with silicon together with tin and/or tungsten.

The 18th aspect of the present invention is a sintered target for producing the transparent conductive thin film of one of the ninth to 15th aspects, comprising indium oxide as the major component and tungsten and germanium, wherein tungsten is incorporated at a W/In atomic ratio of 0.003 to 0.045 and germanium is incorporated at a Ge/In atomic ratio of 0.001 to 0.256.

The 19th aspect of the present invention is the sintered target of the 18th aspect that is used as a target for sputtering or ion plating.

The 20th aspect of the present invention is the sintered target of the 18th aspect that has a surface roughness (Rmax) of 2.9 μm or less on the sputtered surface.

The 21st aspect of the present invention is a process for producing a thin, amorphous, transparent, electroconductive film comprising silicon-doped indium oxide on a substrate by sputtering in an oxygen-containing inert gas atmosphere in a sputtering apparatus that contains the substrate and sintered target of the 16th or 17th aspect.

The 22nd aspect of the present invention is the process of the 21st aspect for producing a transparent conductive thin film, wherein the substrate is heated at 100 to 300° C.

The 23rd aspect of the present invention is the process of the 21st aspect for producing a transparent conductive thin film, wherein the inert gas is a mixture of argon gas and oxygen containing oxygen at 1% or more.

The 24th aspect of the present invention is the process of the 21st aspect for producing a transparent conductive thin film, wherein the film is produced by DC sputtering in an oxygen-containing inert gas atmosphere after pressure in the sputtering apparatus is set at 0.1 to 1 Pa.

The 25th aspect of the present invention is a process for producing a transparent conductive thin film comprising indium oxide doped with tungsten and germanium on a substrate by sputtering or ion plating with the sintered target of the 18th aspect.

The 26th aspect of the present invention is a transparent, electroconductive substrate for display panels, comprising the transparent conductive thin film of one of the first to 15th aspects formed on a substrate selected from the group consisting of glass substrate, quartz plate and resin plate or film.

The 27th aspect of the present invention is the transparent, electroconductive substrate of the 26th aspect for display panels, wherein the substrate is coated with at least one layer selected from the group consisting of electrically insulating, semi-conductor, gas barrier and protective layers.

The 28th aspect of the present invention is an organic electroluminescence device which uses the transparent conductive thin film of one of the first to 15th aspects as the anode and/or cathode.

The 29th aspect of the present invention is the organic electroluminescence device of the 28th aspect, wherein the anode comprises a thin, light-reflecting film and the cathode comprises a transparent conductive thin film or transparent conductive thin film and metallic thin film.

The 30th aspect of the present invention is an organic electroluminescence device which comprises an organic layer and cathode formed on an anode of the transparent, electroconductive substrate according to Claim 26 for display panels.

NOTATION

Figure 1:
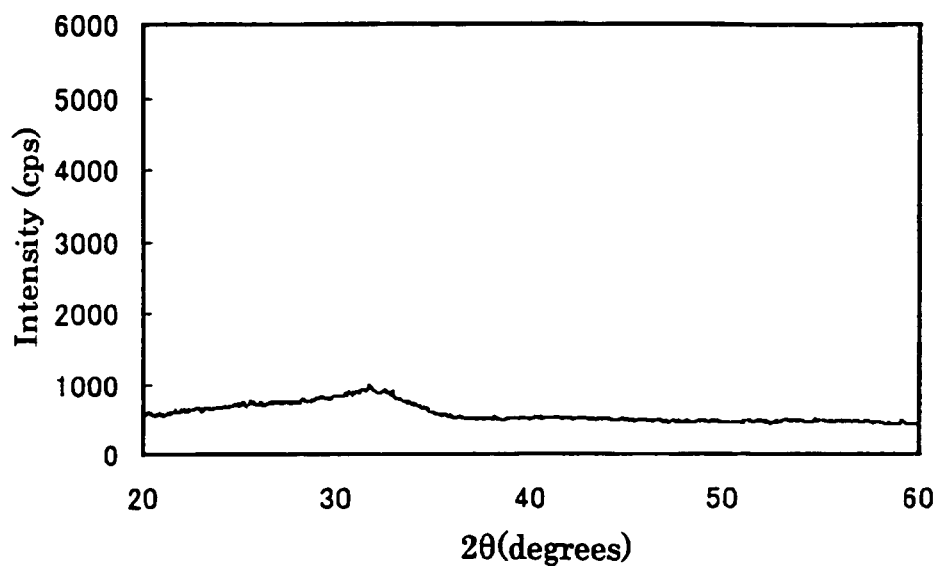
FIG. 1 is an X-ray diffraction pattern of the transparent conductive thin film of the present invention, prepared in EXAMPLE 4.

1. Electrically insulating substrate
2. Anode
3. Cathode
4. Transparent conductive thin film
5. Metallic thin film
6. Organic layer
7. Light-emitting layer
8. Hole-injecting layer
9. Hole-transferring layer

DETAILED DESCRIPTION OF THE INVENTION

The transparent conductive thin film, process for producing the same, sintered target for producing the same, and transparent, electroconductive substrate for display panels and organic electroluminescence devices, both including the transparent conductive thin film, are described in detail.

1. Thin, Transparent, Electroconductive Film

The transparent conductive thin film of the present invention comprises indium oxide as the major component which contains either (1) silicon or (2) tungsten and germanium.

(1) Thin, Transparent, Electroconductive Film Containing Silicon

This transparent conductive thin film comprises indium oxide as the major component which contains silicon as a dopant at a specific content, and has a substantially amorphous structure (this thin film is hereinafter referred to as the first, transparent conductive thin film). A transparent conductive thin film containing, in addition to silicon, tin and/or tungsten as a dopant at a specific content, is included in the concept of the first, transparent conductive thin film.

The substantially amorphous structure for the present invention means that only halo pattern(s) relevant to the amorphous phase are observed but no diffraction peak relevant to the crystalline phase is observed by X-ray diffractometry with the CuKα ray for investigating crystallinity of the film. Taking the crystalline phase of indium oxide as an example, it is important that no diffraction peak is observed at around 22, 31, 35, 37, 46, 52 and 56° as 2θ.

A thin ITO film, i.e., thin, tin-doped indium oxide film, has been used as a transparent conductive thin film for solar cells and various display panels. Its electroconductivity mechanism is explained as follows. Tin tends to be transformed into the tetravalent ion to improve electroconductivity of the film by releasing the carrier electrons when it is dissolved after substituting for indium oxide at the trivalent indium ion site.

Moreover, oxygen deficiency tends to take place in indium oxide, and releases the carrier electrons, when it takes place. Therefore, ITO needs tin as a dopant and, at the same time, an adequate quantity of oxygen deficiencies to have an increased carrier electron density. However, increasing oxygen deficiencies decreases carrier electron mobility. One method for minimizing electrical resistivity of the film is use of another dopant element which, like tin, tends to take the form of tetra-valent ion and releases the carrier electrons when it substitutes for indium oxide at the trivalent indium site. One of the promising elements for the above purpose is silicon.

The $Sn^{4+}$ ion has a slightly smaller ionic radius than the $In^{3+}$ ion, 0.71 versus 0.81 Å. On the other hand, the $Si^{4+}$ ion has a much smaller ionic radius of 0.41 Å than the $In^{3+}$ ion. It is therefore considered that silicon strains the lattice to a higher extent than tin, to make the film amorphous more easily, when they are dissolved to substitute for indium oxide at the indium site.

In the present invention, therefore, silicon is used as a dopant in place of tin, and incorporated at 0.5 to 13% by atom on silicon and indium totaled, preferably 1 to 12%, more preferably 3 to 11%, to improve electroconductivity of the film. Silicon content beyond the above range is not desirable, because the amorphous film may be difficult to obtain at below 0.5% and resistivity of the film may be excessively high at above 13%.

The transparent conductive thin film of the present invention, which comprises indium oxide as the major component and silicon as a dopant, may be further incorporated with tin. According to the above-described electroconductivity mechanism, this film is regarded as the thin ITO film, as the conventional transparent conductive thin film comprising indium oxide as the major component and tin as a dopant, which is further incorporated with silicon.

Tin can improve electroconductivity of the film, when incorporated at 0.5 to 15% by atom on tin and indium totaled, preferably 1 to 13%, more preferably 3 to 10%. Tin content beyond the above range is not desirable, because the amorphous film may be difficult to obtain at below 0.5% and resistivity of the film may be excessively high at above 15%.

The transparent conductive thin film of indium oxide doped with silicon and tin is described above. Incorporating indium oxide with tungsten as a dopant can similarly contribute to improving electroconductivity of the film, because the tetra- to hexa-valent tungsten ion is dissolved to substitute for indium oxide at the tri-valent indium ion site and to release the carrier electrons.

Therefore, tungsten can be incorporated for the present invention in indium oxide doped with silicon or silicon and tin, to produce the thin, amorphous, transparent, electroconductive film.

Tungsten can improve electroconductivity of the film, when incorporated at 0.2 to 15% by atom on tungsten and indium totaled, preferably 1 to 13%, more preferably 3 to 10%. Tungsten content beyond the above range is not desirable, because an amorphous film may be difficult to obtain at below 0.2% and resistivity of the film may be excessively high at above 15%.

The first, transparent conductive thin film is structurally amorphous, and has a crystallization temperature of 180° C. or higher, preferably 180 to 450° C. Crystallization temperature means the temperature level at which the amorphous structure of the transparent conductive thin film is crystallized, as judged by high-temperature X-ray diffractometry. For the present invention, it is the level at which the diffraction peak appears in the analysis in which the thin film is heated from room temperature at 3° C./minute.

The first, transparent conductive thin film of the present invention has a resistivity of $9.0 \times 10^{-4}$ Ω·cm or less, preferably $6.0 \times 10^{-4}$ Ω·cm or less. It can have a resistivity of $3 \times 10^{-4}$ Ω·cm or less, when the film-making conditions are optimized. By contrast, a conventional amorphous ITO film has a resistivity limited to $6 \times 10^{-4}$ Ω·cm to $8 \times 10^{-4}$ Ω·cm, and should be prepared by a special film-making process, as discussed earlier. A film having a resistivity above $9.0 \times 10^{-4}$ Ω·cm is not desirable, because the film should be thicker.

The first, transparent conductive thin film of the present invention has a thickness of 100 to 500 nm, preferably 150 to 450 nm, more preferably 200 to 400 nm. A film having a thickness beyond the above range is not desirable, because it may not reliably have a sufficient resistivity at below 100 nm, and may encounter a problem of coloration at above 500 nm.

The transparent conductive thin film has a transmittance of 85% or more for average visible rays (400 to 800 nm), preferably 90% or more, more preferably 95% or more. A film having a transmittance below 85% may be inapplicable to an organic EL device.

The first, transparent conductive thin film of the present invention is characterized by its smooth surface. More specifically, it has an average centerline roughness (Ra) of 2.5 nm or less. The very smooth, thin film having a Ra value of 1.0 nm or less can be produced, when the film-making conditions are optimized.

The average centerline roughness (Ra) is determined by an atomic force microscope. More specifically, the film is observed in an area of 1 by 1 μm at 10 arbitrarily selected points on the film surface, and the readings are averaged. A film having an Ra value above 2.5 nm is not desirable, because it may be inapplicable to an organic EL electrode directly, and needs smoothening treatment by etching or grinding to support a superthin film of organic compound formed thereon.

(2) Thin, Transparent, Electroconductive Film Containing Tungsten and Germanium

This transparent conductive thin film comprises indium oxide as the major component which contains tungsten and germanium as dopants at a specific content (this thin film is hereinafter referred to as the second, transparent conductive thin film).

The second, transparent conductive thin film comprises indium oxide as the major component and tungsten and germanium at a W/In atomic ratio of 0.00.3 to 0.047 and Ge/In atomic ratio of 0.001 to 0.190. It is particularly preferable that tungsten and germanium are incorporated at a W/In atomic ratio of 0.005 to 0.026 and Ge/In atomic ratio of 0.033 to 0.190.

The second, transparent conductive thin film of the present invention has a resistivity of $8.0 \times 10^{-4}$ Ω·cm or less, preferably $4.0 \times 10^{-4}$ Ω·cm or less. It has an amorphous structure, as confirmed by X-ray diffractometry, crystallization temperature of 180° C. or lower, and surface roughness Ra of 1.5 nm or less.

The second, transparent conductive thin film of the present invention is an $In_2O_3$—W—Ge-based one, comprising indium oxide as the major component which contains tungsten and germanium as the second and third component at a W/In atomic ratio of 0.003 to 0.047 and Ge/In atomic ratio of 0.001 to 0.190. The thin film incorporated with tungsten and germanium each at a content in the above range can be produced by sputtering or ion plating on the substrate kept at a low temperature level of 150° C. or lower. It is of very low resistance, having a resistivity of $8.0 \times 10^{-4}$ Ω·cm or less, or $4.0 \times 10^{-4}$ Ω·cm or less when the composition and film-making conditions are optimized. It is completely amorphous, and excellent in surface smoothness with a surface roughness Ra (average centerline roughness) of 1.5 nm or less.

The present invention is preferably incorporated with tungsten and germanium as the second and third component at a W/In atomic ratio of 0.005 to 0.026 and Ge/In atomic ratio of 0.033 to 0.190. The thin film incorporated with tungsten and germanium each at content in the above range can be produced by sputtering or ion plating on the substrate kept at 150 to 300° C. It is of very low resistance, having a resistivity of $8.0 \times 10^{-4}$ Ω·cm or less, or $4.0 \times 10^{-4}$ Ω·cm or less when the composition and film-making conditions are optimized. It is completely amorphous, and excellent in surface smoothness with a surface roughness Ra of 1.5 nm or less.

The second, transparent conductive thin film, having a crystallization temperature of 180° C. or higher, shows no deterioration of increased resistivity or decreased surface roughness, even when exposed to a heat of 180° C. It is as excellent as ITO in transmittance of visible rays, including the low wavelength region. Tungsten or germanium present at a W/In or Ge/In atomic ratio beyond the above range is not desirable, because it may increase resistivity of the transparent conductive thin film or decrease its surface smoothness because it will be contaminated with the crystalline phase.

2. Sintered Target

The sintered target of the present invention comprises indium oxide as the major component which contains either (1) silicon, or silicon and tin or tungsten, or (2) tungsten and germanium.

(1) Sintered Target Containing Silicon

The sintered target of the present invention containing silicon as a dopant at a specific content (hereinafter referred to as the first sintered target) is an indium oxide-based one, and can be a single target and composite target.

It is described while focusing on the composite targets with a plurality of silicon chips put up, at almost the same intervals, on a sintered target selected from the group consisting of sintered indium oxide, indium oxide doped with tin and indium oxide doped with tungsten as the examples.

The composite sintered target of the present invention is produced by putting up a plurality of silicon chips, at almost the same intervals, on the erosion target surface, e.g., of indium oxide. This composite sintered target can contain silicon at a varying content in a desired range by changing surface area ratio of the silicon chips on the sintered target of indium oxide. Therefore, the effects of the film composition or film-making conditions on amorphous degree or surface smoothness of the resulting transparent conductive thin film can be investigated in detail.

The sintered target of indium oxide serving as the base substantially consists of indium oxide, by which is meant that it contains indium oxide at 99.99% or more and essentially no impurities. The sintered target of tin-doped or tungsten-doped indium oxide is the one made of a tin-doped or tungsten-doped indium oxide sinter.

The indium oxide sinter, when incorporated with tin or tungsten as a dopant, preferably contains tin at 0.5 to 15% by atom or tungsten at 0.2 to 15% by atom (each on indium and the dopant totaled). It may be further incorporated with molybdenum, rhenium, hafnium, germanium, zirconium, titanium, gold, silver, palladium, platinum or copper within limits not harmful to the object of the present invention.

The process for producing sintered indium oxide involves two major steps, where the starting powder is formed into a molded article in the first step, and the molded article is sintered in a furnace in the second step.

The step for forming the starting powder into a molded article uses powdered indium oxide as the starting powder, which may be incorporated, as required, with tin or tungsten oxide. The subsequent sintering step involves a sub-step for setting the molded article on a furnace floor plate or setter in a furnace and subsequent sub-step for sintering the article in an oxygen atmosphere.

Powdered indium oxide as the starting powder has an average particle size of 0.5 μm or less, preferably 0.4 μm or less, with a particle size distribution having the particles of 0.1 to 0.8 μm in size at 85% by weight or more, preferably 95% or more.

Tin or tungsten oxide, when used, preferably has an average particle size of 2.5 μm or less as the starting powder. The starting powders can be mixed with each other and stirred by a known apparatus. The mixture may be granulated in the presence of a binder (PVA) or the like and then adjusted to a particle size of 10 to 100 μm. The resulting granules are pressed at 1000 kg/cm$^2$ or more into a green body.

The type of the sintering furnace for the sintering step is not limited. However, it is normally an electrical heater because of its ease in controlling the heated atmosphere. The green body is sintered at 1400° C. or higher for 1 hour or more, preferably 5 to 20 hours, in a furnace equipped with a sufficient space for oxygen gas flow between the lower side of the green body and the furnace floor plate and between the upper side of the green body and the ceiling plate, while the oxygen gas is passed over the green body surfaces at 1000° C. or higher to replace the oxygen atmosphere in the furnace. On completion of the sintering step, flow of the oxygen gas is stopped, and the sinter is cooled. The sintering step is controlled in such a way to keep temperature fluctuation within the green body at 20° C. or lower.

The green body may be sintered in a flow of oxygen gas for less than 30 minutes, when it is sufficiently small. However, the sintered target of indium oxide has been recently becoming larger. A large body, e.g., exceeding 300 mm square and 5 mm thick body, is more difficult to control for its temperature distribution in the whole body, and it is recommended to hold a body of that size in heat for preferably 60 minutes or more.

The green body can be almost evenly sintered in both plane and thickness directions when heated for a sufficient time, to greatly control scattering of sinter density and average hole number. Moreover, warp of the sinter resulting from uneven heating while it shrinks during the sintering process can be reduced by weight of the sinter itself.

The sintering process is followed by the cooling process, after heating and flow of oxygen gas are stopped. The cooled sinter may be heated again at a sintering temperature (re-sintering).

The sinter thus produced may be machined by surface grinding or the like to have the intended dimensions, and put up on a backing plate to produce the composite target base. It may be of a divided structure, as required, with a plurality of the sinters.

The silicon chip is made of crystalline silicon, e.g., single-crystalline or polycrystalline silicon, formed into a 1 to 10 mm square, 0.5 to 3 mm thick shape. The chip may be of an off-spec grade for a semiconductor base board, in addition to the on-spec one normally used for the board. The composite target of the present invention is produced by putting up a plurality of the chips on the sintered target of indium oxide, described earlier, at almost the same intervals. Silicon can be contained in the film at a varying content in a desired range by changing surface area ratio of the silicon chips on the sintered target of indium oxide.

The sintered target of the present invention has been described mainly with the composite target. However, the situations around the single target are similar. It can be produced by incorporating silicon at a specific content for the indium oxide sinter without needing any special condition.

The silicon is preferably produced from a starting powder of silicon dioxide or the like having an average particle size of 2.5 μm or less. The starting powder can be mixed with indium oxide and stirred by a known apparatus. The mixture may be granulated in the presence of a binder (PVA) or the like and then adjusted to a particle size of 10 to 100 μm. The resulting granules are pressed at 1000 kg/cm$^2$ or more into a green body, which is sintered in a similar manner.

(2) Sintered Target Containing Tungsten and Germanium

The second sintered target of the present invention comprises indium oxide as the major component that necessarily contains tungsten and germanium at a W/In atomic ratio of 0.003 to 0.045 and Ge/In atomic ratio of 0.001 to 0.256. A sintered target containing tungsten or germanium at a content beyond the above range may not give the transparent conductive thin film even when the film-making conditions are adjusted.

Tungsten and germanium as the second and third component for the sintered target are most preferably in the atomic state dissolved in and substituting for indium oxide at the indium site. However, they may be present in the form of indium germanide compound or tungstate compound state dispersed at the atomic level in the sintered body. Tungsten and germanium, when so dispersed, are useful for producing the transparent conductive thin film of low resistance by working to stabilize discharge in the sputtering process. Tungsten and germanium are preferably dispersed substantially evenly. It is particularly preferable that no germanium oxide phase is present.

The second sintered target of the present invention preferably has a surface roughness Rmax (maximum roughness) of 2.9 μm on the sputtered surface. An oxide target, when sputtered for an extended time, has abnormally grown projections (nodules) on the sputtered erosion surface, which may cause arcing or deterioration of film characteristics. By contrast, the second sintered target of the present invention shows no nodules on the erosion surface, even when sputtered for an extended time, by adjusting its surface roughness Rmax at 2.9 μm or less. As a result, arcing can be prevented.

The surface roughness Rmax is a distance between the two straight lines running in parallel to the average line of a cross-sectional curved line extracted to a standard length, coming into contact with the curved line and putting the whole cross-sectional curved line in-between. The standard length is specified by JIS, which provides 6 standard lengths by Rmax range. For example, the standard length is 0.8 mm for an Rmax range of 0.8 to 6.3 μm, and 2.5 mm for an Rmax range of 6.3 to 25 μm. The average line is a line (straight or curved) which represents geometrical shape of the measured plane in the cross-sectional curved line extracted and is set to have the minimum sum of squares of the deviations between itself and the cross-sectional curved line.

3. Process for Producing Transparent Conductive Thin Film

The first and second, transparent conductive thin films of the present invention can be produced by sputtering or ion plating with the above described sintered target. When sputtering is adopted, the thin film can be produced in an inert gas atmosphere containing a specific content of oxygen in an apparatus which includes a substrate and the sintered target of indium oxide doped with silicon, or tungsten and germanium.

The process for producing the first, transparent conductive thin film of the present invention produces a thin, amorphous, transparent, electroconductive film of silicon-doped indium oxide on a substrate under specific sputtering conditions (e.g., substrate temperature, pressure, oxygen concentration) with the sintered target of silicon-doped indium oxide.

The present invention needs DC sputtering with a mixture of argon and oxygen, where oxygen gas should be present at 1% or more, preferably 1 to 5%. Oxygen content beyond the above range is not desirable, because the resulting film may have insufficient transparency and deviated composition resulting from the tendency of the dopant to leave the surface when it is below 1%, and it may have an excessively high resistance when it is above 5%.

The amorphous film can be produced more easily and has higher surface smoothness when pressure in the sputtering apparatus is kept at 0.1 to 1 Pa, in particular 0.3 to 0.8 Pa. Pressure beyond the above range is not desirable, because it is more difficult to make the film amorphous at below 0.1 Pa, and more difficult to densify the film at above 1 Pa.

In the present invention, the film may be produced without heating the substrate. However, the amorphous film can be produced by heating the substrate at 100 to 300° C., in particular 100 to 200° C. The film of the present invention can be also produced by thermally treating the film at below crystallization temperature of the film in air, or an inert or vacuum atmosphere. This effect can be achieved by use of the sintered target of indium oxide containing silicon as the dopant, more effectively by use of the sintered target of indium oxide containing silicon and tungsten as the dopants.

The thin film produced by this process, where indium oxide is doped with silicon by DC sputtering effected under specific conditions, has more distorted lattices than that of tin-doped ITO, with the result that its crystallization temperature increases, making it easier to form the amorphous structure.

In other words, silicon strains the lattice, because $Si^{4+}$ ion has a smaller ionic radius than the $In^{3+}$ ion (0.39 versus 0.92 Å). Moreover, doping indium oxide with tungsten strengthens the In—O covalent bond, thereby stabilizing the amorphous structure. As a result, the amorphous structure of the film can be kept stable, irrespective of film-making conditions other than those described above. Tungsten also works to decrease resistivity of the film.

The conventional RF sputtering techniques have been described for production of the transparent conductive thin film of indium oxide doped with silicon and tin. However, the conventional RF sputtering techniques cannot stably produce a transparent conductive thin film of amorphous and flat/smooth structure.

The inventors of the present invention have attempted to produce a transparent conductive thin film by RF sputtering with a sintered target of indium oxide doped with silicon oxide and pure argon gas, to find that the resultant thin film is crystalline with very rough surfaces, even when the substrate is not heated. The similar trend was observed when the dopant was replaced by silicon oxide and tin oxide.

It is known that plasma generated by RF sputtering has generally much higher energy that that by DC sputtering. As a result, RF sputtering produces a film of higher crystallinity. A highly crystalline film has much rougher and less smooth surfaces, needless to say. Moreover, a thin oxide film having a large quantity of oxygen deficiencies will result, when produced by RF sputtering in an oxygen-free, pure argon gas atmosphere, because oxygen included in the film is limited to that supplied from the target.

The In—O bond in indium oxide that contains a larger quantity of oxygen deficiencies becomes more metallic, with the result that the crystals grow more easily in the film by the heat from the plasma during the film-making process. In other words, RF sputtering in an oxygen-free, pure argon gas atmosphere produces a highly crystalline film with very rough surfaces, even when the substrate is not heated. It is therefore considered that the essential conditions for producing an amorphous film are the incorporation of silicon in the film and, at the same time, the use of DC sputtering of low plasma energy with a sputtering gas of argon/oxygen mixture containing oxygen at 1% or more.

A film of indium oxide doped with silicon or silicon and tin will be crystalline, when produced by RF sputtering with pure argon as a sputtering gas. However, indium oxide doped with tungsten in addition to silicon can be stably made into an amorphous film even under the above conditions.

Moreover, tungsten also works to decrease film resistivity.

The inventors of the present invention have confirmed that the In—O bond in indium oxide becomes more covalent in nature in the presence of tungsten by estimating its properties by the DV-Xα method for molecular orbit calculation. It is estimated that the film has a higher crystallization temperature as the In—O bond becomes more covalent. This has been also confirmed experimentally.

Crystallization temperature of an $In_2O_3$ film is around 150° C. It is increased to around 200° C., when only tungsten is incorporated at 0.6% by atom, as confirmed by high-temperature X-ray diffractometry. It is therefore considered that indium oxide doped with tungsten in addition to silicon can be stably made into an amorphous film with smooth surfaces.

Silicon-doped indium oxide can be made into a completely amorphous film, even when produced at a low gas pressure. It is made into an amorphous film more easily, when the substrate is heated. In other words, indium oxide doped with a sufficient quantity of silicon, having an increased crystallization temperature, can be made into an amorphous film, even when sputtering substantially increases substrate temperature or the substrate is intentionally heated, so long as the film is exposed to a temperature below the crystallization temperature determined by film composition.

For the conventional ITO to be made into an amorphous film by sputtering, it is necessary to carry out the sputtering process under a high gas pressure to decrease energy of the sputtered particles, while keeping the substrate unheated. However, silicon-doped indium oxide for the present invention can be made into a completely amorphous film even under a lower gas pressure. In other words, indium oxide doped with a sufficient quantity of silicon, having an increased crystallization temperature, can be made into a film of amorphous structure, even when sputtering substantially increases substrate temperature or the substrate is intentionally heated, so long as the film is exposed to a temperature below the crystallization temperature determined by the film composition.

The process for producing the second, transparent conductive thin film of the present invention produces a thin, amorphous, transparent, electroconductive film on a substrate under specific sputtering conditions (e.g., substrate temperature, pressure, oxygen concentration) with the sintered target of indium oxide doped with tungsten and germanium.

The second, transparent conductive thin film of the present invention can be produced by common sputtering or ion plating. When sputtering is adopted, compositional difference between the sintered target and the thin film with which it is produced depends on gas pressure, oxygen content of sputtering gas, distance between the target and substrate, and magnetic field intensity in the plasma. In ion plating, the compositional difference between the film and target also depends on gas pressure during the film-making process, and distance between the target and substrate.

Sputtering, when adopted, needs DC sputtering with a mixture of argon and oxygen. It is important to have an oxygen content of 0.3% or more, preferably 0.5 to 5%. Oxygen content beyond the above range is not desirable, because the resulting film may have insufficient transparency and deviated composition resulting from tendency of the dopant to leave the surface when it is below 0.3%, and may have an excessively high resistance when it is above 5%.

The amorphous film can be produced more easily and has higher surface smoothness when pressure in the sputtering apparatus is kept at 0.1 to 1 Pa, in particular, at 0.3 to 0.8 Pa. Pressure beyond the above range is not desirable, because it is more difficult to make the film amorphous at below 0.1 Pa, and more difficult to densify the film at above 1 Pa.

In the present invention, the film may be produced without heating the substrate. However, the amorphous film can be produced by heating the substrate at 100 to 300° C. The film of the present invention can be also produced by thermally treating the film at below crystallization temperature of the film in air, or an inert or vacuum atmosphere.

The second, transparent conductive thin film of the present invention produced by this process, where indium oxide is doped with tungsten and germanium by DC sputtering effected under specific conditions, has more distorted lattices than that of tin-doped, with the result that its crystallization temperature increases, making it easier to form the amorphous structure.

4. Transparent, Electroconductive Substrate for Display Panels

The transparent, electroconductive substrate of the present invention for display panels comprises the first or second, transparent conductive thin film formed on a substrate selected from the group consisting of glass substrate, quartz plate and resin plate or film.

Display panels include LCD, PDP and EL devices. The transparent, electroconductive substrate of the present invention for display panels incorporates the transparent conductive thin film that functions as the anode and/or cathode for the panel. The substrate also functions as a light-transmitting support, and hence should have a certain strength and transparency.

The materials suitably used for constituting the resin plate or film includes polyethylene terephthalate (PET), polyether sulfone (PES), polyarylate and polycarbonate. The resin plates or films of these materials may be coated with an acrylic resin.

Thickness of the substrate is not limited. However, it is 0.5 to 10 mm, preferably 1 to 5 mm for the glass substrate or quartz plate, and 0.1 to 5 mm, preferably 1 to 3 mm for the resin plate or film. Thickness beyond the above range is not desirable, because the substrate may be insufficient in strength and difficult to handle when it is thinner than the lower limit, and may be deteriorated in transparency and excessively heavy when it is thicker than the upper limit.

The substrate may be coated with at least one of an electrically insulating, semi-conductor, gas barrier or protective layer. The electrically insulating layer may be of silicon oxide (Si—O) or silicon oxynitride (Si—O—N). The semi-conductor layer may be of a thin-film transistor (TFT), and formed mainly on a glass substrate. The gas barrier layer may be formed on a resin plate or film as a steam barrier layer. The protective layer works to protect the substrate surface from scratches or impact, and of a varying coating material, e.g., silicon-, titanium- or acrylic-based one. The layer which can be formed on the substrate is not limited to the above. For example, a thin, electroconductive, metallic layer may be also used.

The transparent, electroconductive substrate of the present invention for display panels is very useful as a part for various display panels, because it comprises a transparent conductive thin film excellent in resistivity, light transmittance and surface flatness, among other features.

5. Organic Electroluminescence Device

The organic electroluminescence device of the present invention comprises the first or second, transparent conductive thin film which functions as the anode and/or cathode. It falls into two types: (A) a device having a thin, light-reflecting film for the anode, and the transparent conductive thin film for the cathode, where the film may be combined with a thin metallic film, and (B) a device having the transparent, electroconductive substrate for display panels described above with the transparent conductive thin film serving as the cathode, where the substrate is coated with an organic layer and the anode.

Figure 7:
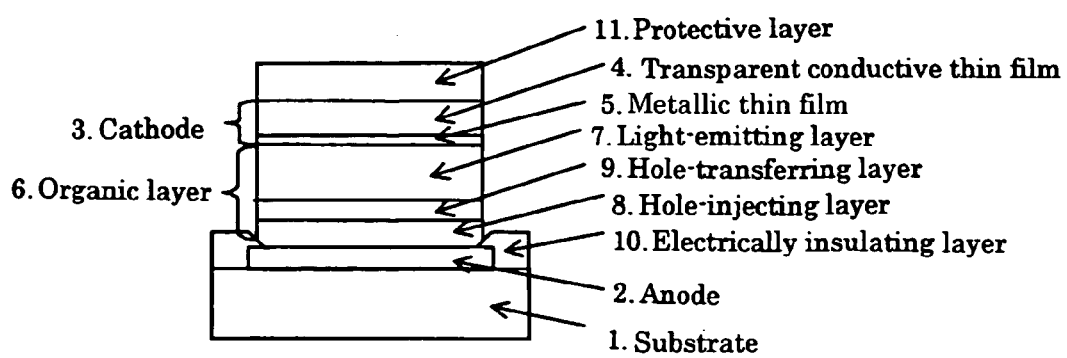
FIG. 7 outlines one example of the organic EL device of the present invention.

FIG. 7 shows one example of the structure of the organic electroluminescence device of the present invention. It has the anode 2 and cathode 3, which hold in-between the organic layer 6 containing the light-emitting layer 7. At least one of the anode 2 and cathode 3 comprises the transparent conductive thin film 4 of the present invention, which may be combined with the thin metallic film 5.

The organic layer 6 may be of monolayer structure with the light-emitting layer 7, which emits light produced by recombination of the holes and electrons supplied from the anode 2 and cathode 3, respectively. It may be also of a multi-layered structure (laminate) with the hole-injecting layer 8 and hole-transferring layer 9 or the like. Moreover, it may be of a structure with the protective layer 11 and electrically insulating layer 10 on the transparent conductive thin film 4 and substrate 1, respectively.

The organic layer 6, held between the anode 2 and cathode 3, provides various functions: (1) function of injecting holes from the anode 2 side and electrons from the cathode 3 side, when put in an electrical field, (2) function of transferring the injected charges (electrons and holes) by an electrical field force, and (3) function of providing a field in the light-emitting layer 7 for recombining the electrons and holes. It also provides a light-emitting function by connecting these functions to each other for emitting light.

Each of the hole-injecting layer 8 and hole-transferring layer 9 is composed of a hole-transferring compound, and function to transfer the holes, injected from the anode 2, to the light-emitting layer 7. A large quantity of the holes can be injected into the light-emitting layer 7 at a low electrical field in the presence of the hole-injecting layer 8 and hole-transferring layer 9 between the anode 2 and light-emitting layer 7.

The cathode 3 is basically composed of the transparent conductive thin film 4 of the present invention. However, it may be of a two-layered structure (laminate) with the transparent conductive thin film 4 and thin, metallic layer 5. The thin, metallic layer 5 is provided to inject the electrons more efficiently into the organic layer 6 containing the light-emitting layer 7. The electrons to be injected from the cathode 3 side into the light-emitting layer 7 are accumulated in the light-emitting layer 7 at near the interface by the electron barrier present in the interface between the light-emitting layer 7 and hole-transferring layer 9, to improve light-emitting efficiency of the EL device. The thin, metallic layer 5 preferably has a light transmittance of 50% or more, more preferably 60% or more, to have a transparent light-emitting device. The thin, metallic layer 5 is preferably superthin at around 0.5 to 20 nm. The thin, metallic layer 5 is preferably of a metal having a work function of 3.8 eV or less. The preferable metals include Mg, Ca, Ba, Sr, Yb, Eu, Y, Sc, Li and alloys thereof.

On the other hand, the anode 2 is preferably an electroconductive metal having a work function of 4.4 eV or more, more preferably 4.8 eV or more, or a transparent conductive thin film or laminate thereof. The electroconductive metals useful for the present invention may not be necessarily transparent, and may be coated with a black-colored carbon layer or the like. The metals useful for the present invention include Au, Pt, Ni, Pd, Cr and W. For the transparent conductive thin film, the transparent conductive thin films of the present invention, the first one (In—Si—O, In—Si—Sn—O, In—Si—W—O or In—Si—Sn—W—O) and the second one (In—W—Ge—O) are useful, needless to say. The anode that uses the transparent conductive thin film of the present invention corresponds to the thin, transparent, electroconductive substrate for display panels, which is provided with the substrate.

The laminates useful for the present invention include Au and In—Si—O, Pt and In—Si—O, In—Si—W—O and Pt, Au and In—W—Ge—O, and Pt and In—W—Ge—O. The anode may be of a two-layered structure with an electroconductive layer having a work function of 4.8 eV or less on the side opposite to the organic layer, because the anode can perform its function when it has a work function of 4.8 eV or more on the interface with the organic layer. In this case, the useful materials for the electroconductive layer include metals, e.g., Al, Ta and Nb; and alloys, e.g., Al and Ta—W. They also include electroconductive polymers, e.g., doped polyaniline and polyphenylene vinylene; amorphous semiconductors, e.g., a-Si, a-SiC and a-C. Still more, they include black, semi-conductive oxides, e.g., $Cr_2O_3$, $Pr_2O_5$, NiO, $Mn_2O_5$ and $MnO_2$.

(A) Organic EL Device having a Thin, Light-reflecting Film for the Anode, and the Transparent Conductive Thin Film for the Cathode This type is one of the preferred embodiments of the EL device of the present invention. Referring to FIG. 7, this EL device uses a thin, light-reflecting film (e.g., of chromium) for the anode 2, and the transparent conductive thin film 4 of the present invention for the cathode 3, where the transparent conductive thin film 4 may be combined with the thin, metallic layer 5. This EL device can efficiently emit light mainly from the cathode 3 side, because the cathode 3 is composed of the transparent conductive thin film 4 of the present invention.

(B) Organic EL Device Having the Transparent, Electroconductive Substrate Serving as the Cathode, which is coated with an organic layer and the Anode.

This type of EL device emits light from the transparent substrate side. It has the transparent, electroconductive substrate for display panels with the transparent conductive thin film formed on the transparent, electrically insulating substrate 1, which is coated with the anode 2 and organic layer 6 or the like. The transparent, electrically insulating substrate 1 may be of glass, or resin film coated with a barrier film, e.g., steam barrier film of resin, silicon oxide or silicon oxynitride.

The organic EL device of the present invention is characterized by high average luminance during the initial stage and long half-life of luminance.

EXAMPLES

The present invention is described in detail by EXAMPLES, which by no means limit the present invention.

Properties of the transparent conductive thin film were determined by the following procedures.

(1) The composition of the transparent conductive thin film was determined by ICP emission spectroscopy for the film prepared in the same manner as that for the present invention, except that quartz glass was replaced by polyimide film for the substrate. The polyimide film was substantially free of silicon, indium, tin, tungsten or germanium element, as confirmed by ICP emission spectroscopy.

(2) The crystallinity of the thin film was analyzed by X-ray diffractometry with CuKα ray, transmission electron microscopy and electron diffractometry.

(3) The crystallization temperature of the thin film was determined by high-temperature X-ray diffractometry. The film was analyzed by X-ray diffractometry while it was heated from room temperature at 3° C./minute. The temperature level at which a diffraction peak appeared was judged to be its crystallization temperature.

(4) The resistivity of the transparent conductive thin film was measured by the 4-probe method, and the light transmittance of the film, including the substrate, was determined by spectrophotometry.

(5) The average centerline roughness (Ra) of the film surface was determined by an atomic force microscope, where the film was observed in an area of 1 by 1 μm at 10 arbitrarily selected points on the film surface, and the readings were averaged.

Examples 1 to 6

Powdered $In_2O_3$ (purity: 99.99%) was pressed and fired at 1400° C. to prepare an indium oxide sinter. It was formed into a shape, 6 in. in diameter and 5 mm thick, and put up on a backing plate of oxygen-free copper via an In-based alloy, to prepare a target of $In_2O_3$. Chips of 99.99% pure single-crystalline silicon, 1 by 1 by 0.5 mm or 2 by 2 by 1 mm in size, were placed at the same intervals on the erosion surface of the target, to prepare a composite target.

A transparent conductive thin film, about 100 to 300 nm thick was prepared by the following procedure. The above target for sputtering was set on a cathode for the non-magnetic target in a DC magnetron sputtering apparatus, and a quartz glass substrate, 50 by 50 by 1.0 mm in size, was set in such a way to face the target, 70 mm apart. Ar gas (purity: 99.9999% by weight) was passed into the chamber when degree of vacuum reached $1\times10^{-4}$ Pa or less in the chamber. Oxygen was passed into the film-making gas to obtain 1 to 3% of oxygen in the gas, while the chamber was kept at 0.6 Pa. DC power of 100 to 200 W was applied to the target-substrate space to produce DC plasma for sputtering, while the substrate was kept at room temperature.

The thin indium oxide film of varying silicon content was prepared with the composite target of varying number of single-crystalline chips on the $In_2O_3$ target. The resistivity and visible light transmittance of the film varied with the oxygen content of the sputtering gas. Composition and surface roughness were analyzed in detail for the film showing the lowest resistivity while keeping visible light transmittance of at least 80% in each EXAMPLE.

Figure 2:
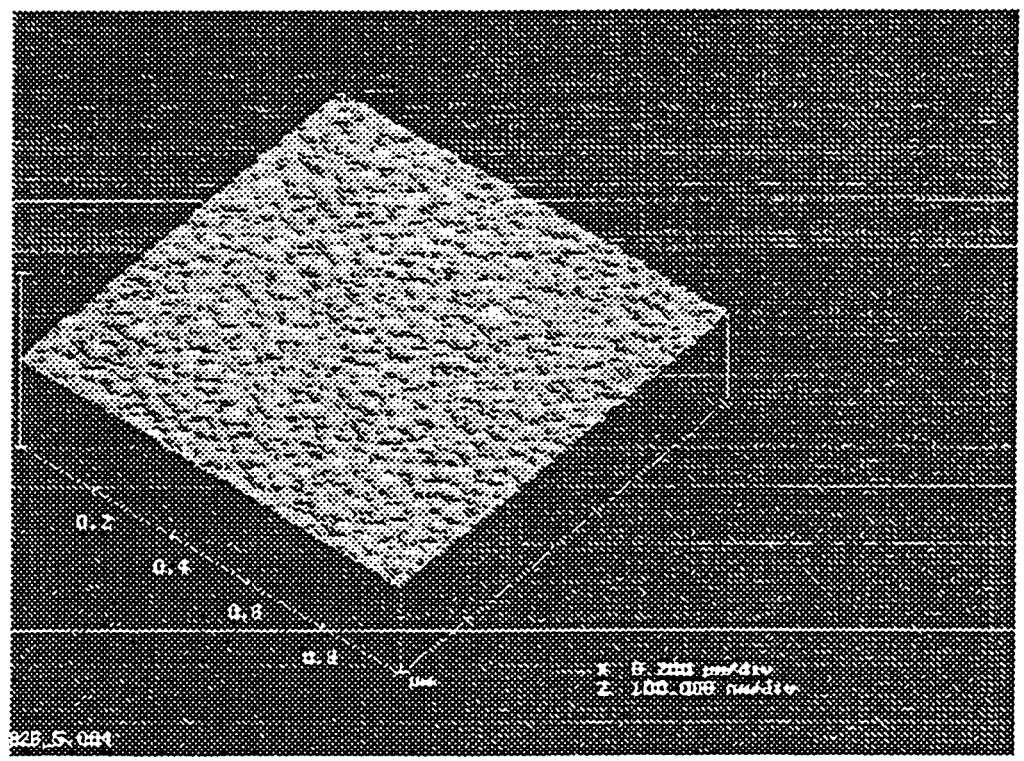
FIG. 2 is an atomic force microscopic image of the transparent conductive thin film of the present invention, prepared in EXAMPLE 4.

FIGS. 1 and 2 show an X-ray diffraction pattern and atomic force microscopic image of the film prepared in EXAMPLE 4, respectively. Table 1 gives Si atom content (silicon ratio to silicon and indium totaled), resistivity, crystallinity and surface roughness Ra (averaged) of the film prepared in each EXAMPLE. X-ray diffractometry detected no peak at 22, 31, 35, 37, 46, 52 or 56° as 2θ.

TABLE 1

| EXAMPLE | Si atom content of the film (%) | Substrate temperature (° C.) | Resistivity (Ω · cm) | Crystallinity | Surface roughness Ra |
|---|---|---|---|---|---|
| 1 | 0.5 | 25 | $5.6 \times 10^{-4}$ | Amorphous | 2.48 |
| 2 | 2.3 | 100 | $4.2 \times 10^{-4}$ | Amorphous | 2.10 |
| 3 | 5.2 | 100 | $4.6 \times 10^{-4}$ | Amorphous | 1.23 |
| 4 | 7.4 | 100 | $4.8 \times 10^{-4}$ | Amorphous | 0.94 |
| 5 | 10.5 | 200 | $6.5 \times 10^{-4}$ | Amorphous | 0.95 |
| 6 | 13.0 | 300 | $8.8 \times 10^{-4}$ | Amorphous | 1.25 |

As shown in Table 1, indium oxide doped with silicon at a content specified for the present invention was kept amorphous, when made into a film by sputtering even at a low gas pressure of 0.6 Pa with the substrate heated at 100 to 300° C. The films had a low resistivity of $8.8\times10^{-4}$ Ω·cm or less, mostly $6.0\times10^{-4}$ Ω·cm or less. Average centerline surface roughness Ra, determined by atomic force microscopy, was very low at 2.48 nm or less for all of the films analyzed. Average visible light transmittance of the film (including the substrate) was also high at 85 to 90%. Crystallinity of the amorphous, transparent conductive thin films prepared in EXAMPLES 1 to 6 was 190 to 390° C., as determined by high-temperature X-ray diffractometry.

The films were also prepared in the same manner as in EXAMPLES 1 to 6, except that the composite target was replaced by a single sintered target of silicon-doped indium oxide. For production of the sintered target of silicon-doped indium oxide, a mixture of powdered indium and silicon oxide (starting powder) was prepared, pressed, fired and then ground. DC sputtering was carried out in an argon/oxygen mixture gas containing oxygen at 1 to 3% with the above target and substrate kept at varying temperature from room temperature to 300° C. The evaluation results of these films were almost the same as those given in Table 1. It is therefore found that an amorphous film of excellent surface smoothness and low resistivity can be produced not only with the composite target containing the chips but also with the sintered target of silicon-doped indium oxide.

Examples 7 to 22

The composite target was prepared using a sintered target of indium oxide doped with tin of varying content (i.e., ITO), in place of the indium oxide target, and placing chips of single-crystalline silicon at the same intervals immediately above the erosion surface of the target. It was 6 in. in diameter and 5 mm thick, as before.

The thin films of indium oxide doped with tin and silicon, about 100 to 300 nm thick, were prepared in a manner similar to those for EXAMPLES 1 to 6, where oxygen content of the sputtering gas was kept at 1 to 3%. Composition and surface roughness were analyzed for the film showing the lowest resistivity while keeping visible light transmittance of at least 80% in each EXAMPLE. Table 2 gives Sn atom content (tin ratio to indium and tin totaled), Si atom content (silicon ratio to silicon and indium totaled), resistivity, crystallinity and average centerline surface roughness (Ra) of the film prepared in each EXAMPLE analyzed in a similar manner.

TABLE 2

| EXAMPLE | Sn atom content of the film (%) | Si atom content of the film (%) | Substrate temperature (° C.) | Resistivity ($\Omega \cdot$ cm) | Crystallinity | Surface roughness Ra |
|---|---|---|---|---|---|---|
| 7 | 0.5 | 1.1 | 25 | $5.0 \times 10^{-4}$ | Amorphous | 2.30 |
| 8 | 1.2 | 5.4 | 100 | $5.2 \times 10^{-4}$ | Amorphous | 2.42 |
| 9 | 3.5 | 3.5 | 200 | $3.8 \times 10^{-4}$ | Amorphous | 2.21 |
| 10 | 3.4 | 7.5 | 200 | $3.5 \times 10^{-4}$ | Amorphous | 2.10 |
| 11 | 3.5 | 10.2 | 200 | $4.0 \times 10^{-4}$ | Amorphous | 2.05 |
| 12 | 3.8 | 12.5 | 200 | $4.5 \times 10^{-4}$ | Amorphous | 2.32 |
| 13 | 7.4 | 1.2 | 25 | $5.6 \times 10^{-4}$ | Amorphous | 1.95 |
| 14 | 7.7 | 3.2 | 100 | $3.5 \times 10^{-4}$ | Amorphous | 1.98 |
| 15 | 7.5 | 7.5 | 200 | $4.6 \times 10^{-4}$ | Amorphous | 1.85 |
| 16 | 7.6 | 10.5 | 200 | $5.2 \times 10^{-4}$ | Amorphous | 1.75 |
| 17 | 7.4 | 12.6 | 200 | $5.4 \times 10^{-4}$ | Amorphous | 1.85 |
| 18 | 10.3 | 3.0 | 100 | $5.5 \times 10^{-4}$ | Amorphous | 0.95 |
| 19 | 10.1 | 8.0 | 200 | $5.6 \times 10^{-4}$ | Amorphous | 0.85 |
| 20 | 10.5 | 9.0 | 200 | $5.8 \times 10^{-4}$ | Amorphous | 0.87 |
| 21 | 14.9 | 2.0 | 100 | $5.5 \times 10^{-4}$ | Amorphous | 1.12 |
| 22 | 15.0 | 12.0 | 300 | $5.7 \times 10^{-4}$ | Amorphous | 1.25 |

As shown in Table 2, indium oxide doped with silicon and tin, each at a content specified for the present invention, was kept amorphous, when made into a film by sputtering even at 200° C. Resistivity was low at $5.8 \times 10^{-4}$ $\Omega \cdot$cm or less. Average centerline surface roughness (Ra), determined by atomic force microscopy, was very low at 2.42 or less. Average visible light transmittance of the film (including the substrate) was also high at 84 to 90%. The crystallinity of the amorphous, transparent conductive thin films prepared in EXAMPLES 7 to 22 was 180 to 320° C., as determined by high-temperature X-ray diffractometry.

The films were also prepared in the same manner as in EXAMPLES 7 to 22, except that the composite target was replaced by a single sintered target of indium oxide doped with silicon and tin element. For production of the sintered target of indium oxide doped with silicon and tin, a mixture of powdered indium oxide, silicon oxide and tin oxide (starting powder) was prepared, pressed, fired and then ground. DC sputtering was carried out in an argon/oxygen mixture gas containing oxygen at 1 to 3% with the above target and substrate kept at varying temperature from room temperature to 300° C. The evaluation results of these films were almost the same as those given in Table 2. It is therefore found that an amorphous film of excellent surface smoothness and low resistivity can be produced not only with the composite target containing the chips but also with the sintered target of indium oxide doped with silicon and tin elements.

Examples 23 to 42

The composite target was prepared using a sintered target of indium oxide doped with tungsten of varying content, in place of the indium oxide target, and placing chips of single-crystalline silicon at the same intervals on the erosion surface of the target. It was 6 in. in diameter and 5 mm thick as before.

The thin films of indium oxide doped with tungsten and silicon, about 100 to 300 nm thick, were prepared in a manner similar to those for EXAMPLES described above, where oxygen content of the sputtering gas was kept at 1 to 3%. Composition and surface roughness were analyzed for the film showing the lowest resistivity while keeping visible light transmittance of at least 80% in each EXAMPLE. Table 3 gives W atom content (tungsten ratio to tungsten and indium totaled), Si atom content (silicon ratio to silicon and indium totaled), resistivity, crystallinity and average centerline surface roughness (Ra) of the film prepared in each EXAMPLE, analyzed in a similar manner.

TABLE 3

| EXAMPLE | W atom content of the film (%) | Si atom content of the film (%) | Substrate temperature (° C.) | Resistivity ($\Omega \cdot$ cm) | Crystallinity | Surface roughness Ra |
|---|---|---|---|---|---|---|
| 23 | 0.2 | 1.0 | 25 | $7.8 \times 10^{-4}$ | Amorphous | 2.46 |
| 24 | 0.4 | 1.1 | 25 | $3.8 \times 10^{-4}$ | Amorphous | 2.41 |
| 25 | 0.6 | 1.1 | 25 | $3.8 \times 10^{-4}$ | Amorphous | 2.41 |
| 26 | 0.6 | 2.3 | 25 | $4.5 \times 10^{-4}$ | Amorphous | 0.89 |
| 27 | 0.6 | 2.4 | 100 | $3.3 \times 10^{-4}$ | Amorphous | 0.51 |
| 28 | 1.1 | 5.0 | 100 | $4.2 \times 10^{-4}$ | Amorphous | 2.25 |
| 29 | 3.2 | 3.1 | 100 | $3.4 \times 10^{-4}$ | Amorphous | 2.21 |
| 30 | 3.1 | 7.7 | 200 | $4.5 \times 10^{-4}$ | Amorphous | 1.90 |
| 31 | 3.0 | 10.2 | 200 | $4.7 \times 10^{-4}$ | Amorphous | 2.23 |
| 32 | 3.3 | 12.5 | 200 | $4.3 \times 10^{-4}$ | Amorphous | 2.31 |
| 33 | 7.1 | 1.1 | 25 | $5.6 \times 10^{-4}$ | Amorphous | 2.22 |
| 34 | 7.2 | 3.7 | 100 | $3.4 \times 10^{-4}$ | Amorphous | 1.72 |
| 35 | 7.1 | 6.0 | 200 | $4.7 \times 10^{-4}$ | Amorphous | 2.35 |

TABLE 3-continued

| EXAMPLE | W atom content of the film (%) | Si atom content of the film (%) | Substrate temperature (° C.) | Resistivity (Ω·cm) | Crystallinity | Surface roughness Ra |
|---|---|---|---|---|---|---|
| 36 | 7.5 | 10.0 | 200 | $4.2 \times 10^{-4}$ | Amorphous | 1.55 |
| 37 | 7.4 | 12.8 | 200 | $5.2 \times 10^{-4}$ | Amorphous | 1.75 |
| 38 | 11.1 | 3.5 | 100 | $5.5 \times 10^{-4}$ | Amorphous | 1.95 |
| 39 | 11.5 | 5.3 | 200 | $5.3 \times 10^{-4}$ | Amorphous | 1.67 |
| 40 | 11.5 | 9.9 | 200 | $5.5 \times 10^{-4}$ | Amorphous | 1.54 |
| 41 | 13.9 | 2.3 | 100 | $5.1 \times 10^{-4}$ | Amorphous | 1.30 |
| 42 | 14.9 | 11.9 | 300 | $4.3 \times 10^{-4}$ | Amorphous | 1.16 |

As shown in Table 3, indium oxide doped with silicon and tungsten each at a content specified for the present invention was kept amorphous, when made into a film by sputtering even at 300° C. Resistivity was low at $5.6 \times 10^{-4}$ Ω·cm or less. Average centerline surface roughness (Ra), determined by atomic force microscopy, was very low at 2.41 or less. Average visible light transmittance of the film (including the substrate) was also high at 85 to 90%. Crystallinity of the amorphous, transparent conductive thin films prepared in EXAMPLES 23 to 42 was 180 to 450° C., as determined by high-temperature X-ray diffractometry.

The films prepared in EXAMPLES 1 to 42 were measured for their etching characteristics with a weakly acidic etchant. Their etching characteristics were good, because all of the films could be etched at a high rate leaving no etching-caused residue.

The films were also prepared in the same manner as in EXAMPLES 23 to 42, except that the composite target was replaced by a single sintered target of indium oxide doped with silicon and tungsten element. For production of the sintered target of indium oxide doped with silicon and tungsten, a mixture of powdered indium oxide, silicon oxide and tungsten oxide (starting powder) was prepared, pressed, fired and then ground. DC sputtering was carried out in an argon/oxygen mixture gas containing oxygen at 1 to 3% with the above target and substrate kept at varying temperature from room temperature to 300° C. The evaluation results of these films were almost the same as those given in Table 3. It is therefore found that an amorphous film of excellent surface smoothness and low resistivity can be produced not only with the composite target containing the chips but also with the sintered target of indium oxide doped with silicon and tungsten element.

Comparative Examples 1 to 6

Thin films, about 100 to 300 nm thick, were prepared by sputtering with a sintered target of impurity-free indium oxide or tin-doped indium oxide (ITO), both having been used widely. Gas pressure during the sputtering process, target-substrate distance and target size were the same as those for the EXAMPLES described above. The oxygen content of the sputtering gas was kept at 1 to 3%. The composition and surface roughness were analyzed for the film showing the lowest resistivity while keeping visible light transmittance of at least 80% in each COMPARATIVE EXAMPLE. Table 4 gives the Sn atom content (tin ratio to indium and tin totaled), resistivity, crystallinity and average centerline surface roughness (Ra) of the film prepared in each COMPARATIVE EXAMPLE, analyzed in a similar manner.

TABLE 4

| COMPARATIVE EXAMPLE | Sn atom content of the film (%) | Substrate temperature (° C.) | Resistivity (Ω·cm) | Crystallinity | Surface roughness Ra |
|---|---|---|---|---|---|
| 1 | 0 | 25 | $4.0 \times 10^{-3}$ | Amorphous/crystalline mixture | 5.34 |
| 2 | 0 | 100 | $3.8 \times 10^{-3}$ | Crystalline | 8.84 |
| 3 | 4.5 | 25 | $5.2 \times 10^{-4}$ | Amorphous/crystalline mixture | 5.54 |
| 4 | 4.6 | 200 | $4.5 \times 10^{-4}$ | Crystalline | 7.95 |
| 5 | 7.5 | 200 | $2.5 \times 10^{-4}$ | Crystalline | 8.45 |
| 6 | 14.8 | 200 | $5.6 \times 10^{-4}$ | Crystalline | 9.51 |

Figure 3:
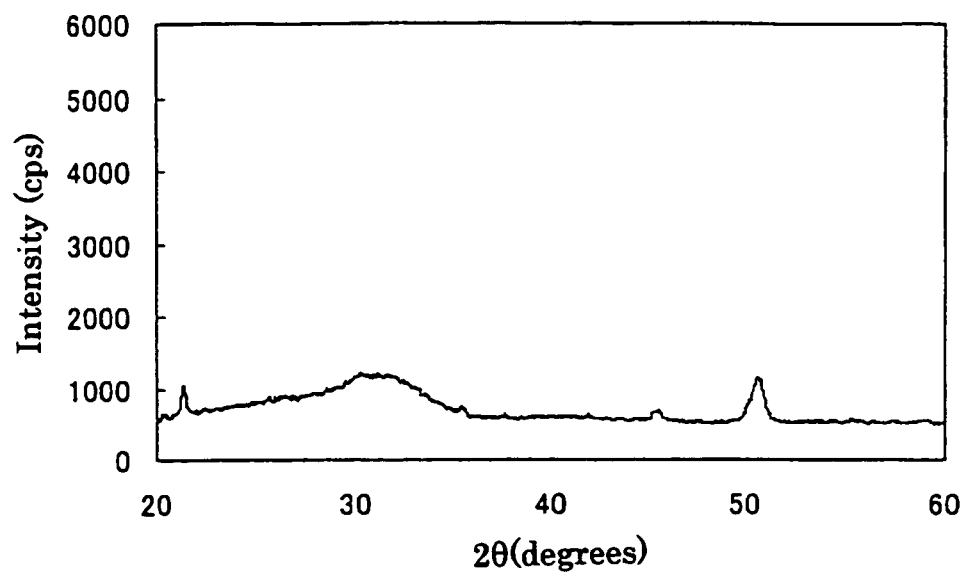
FIG. 3 is an X-ray diffraction pattern of a transparent conductive thin film, prepared by the conventional technique in COMPARATIVE EXAMPLE 3.
Figure 4:
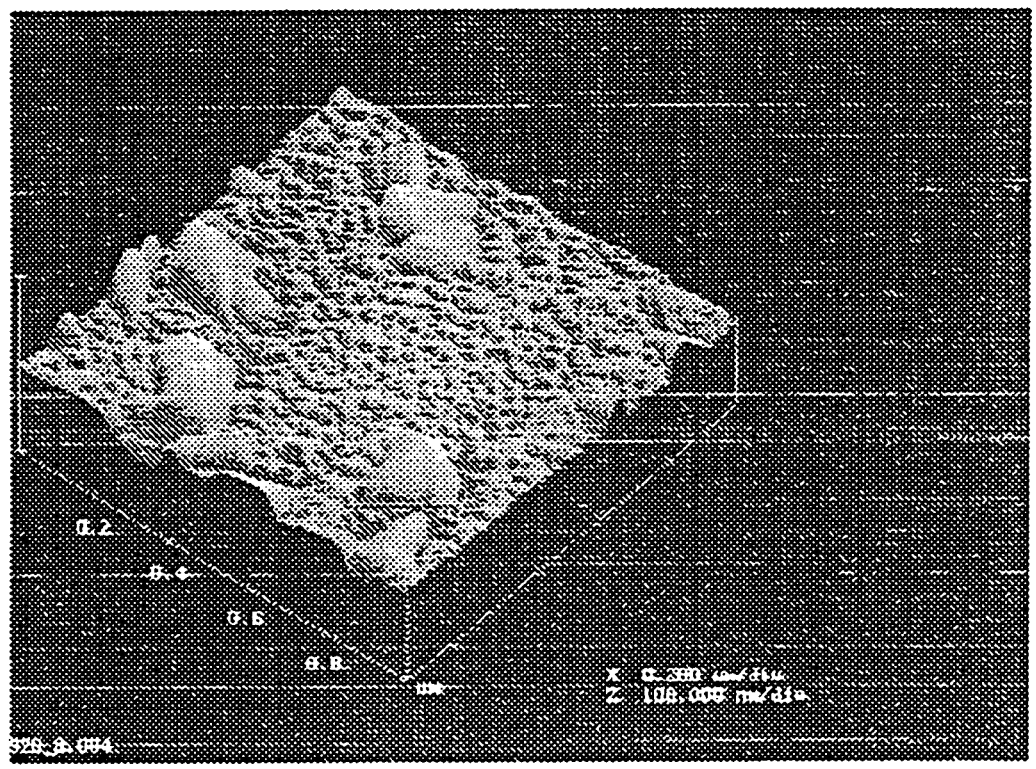
FIG. 4 is an atomic force microscopic image of a transparent conductive thin film, prepared by the conventional technique in COMPARATIVE EXAMPLE 3.
Figure 5:
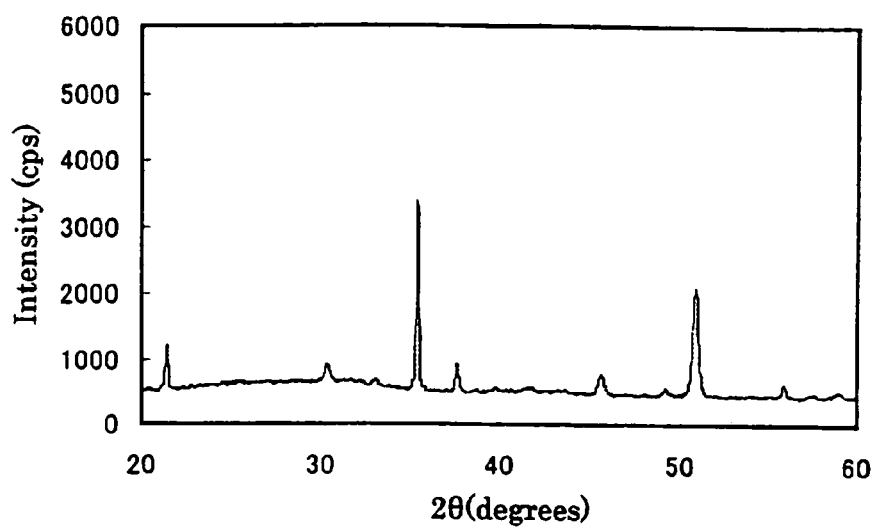
FIG. 5 is an X-ray diffraction pattern of a transparent conductive thin film, prepared by the conventional technique in COMPARATIVE EXAMPLE 5.
Figure 6:
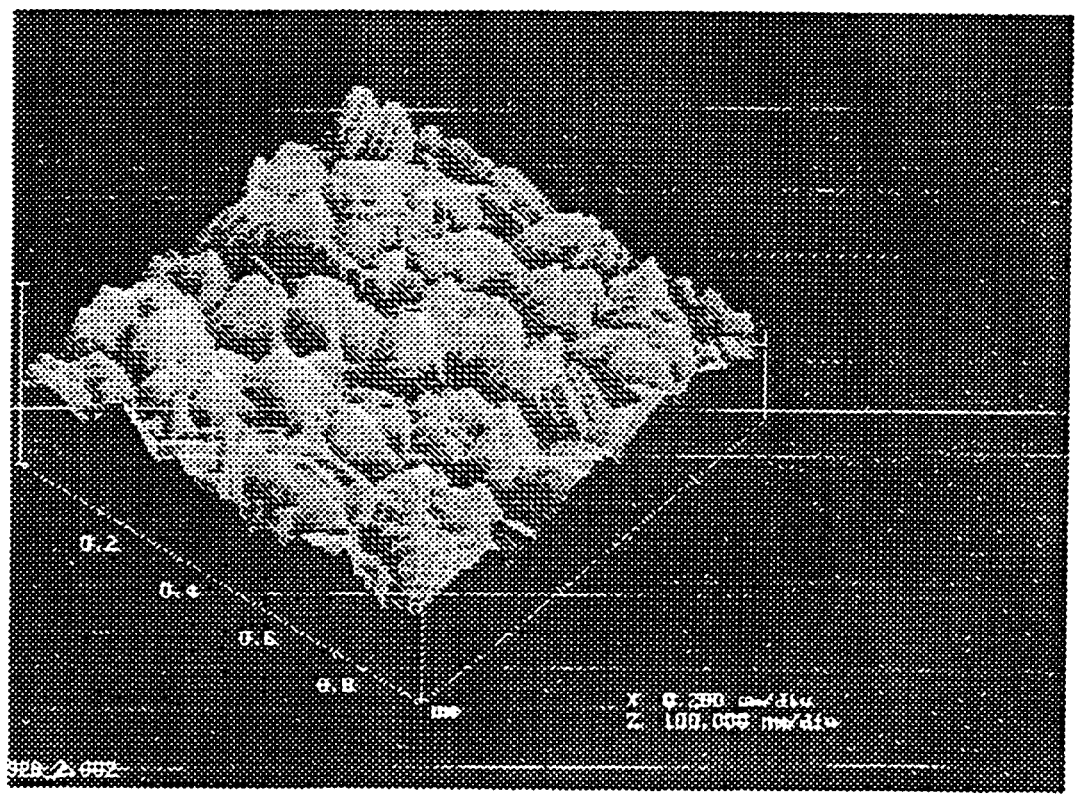
FIG. 6 is an atomic force microscopic image of a transparent conductive thin film, prepared by the conventional technique in COMPARATIVE EXAMPLE 5.

As shown in Table 4, the thin films prepared in COMPARATIVE EXAMPLES 1 to 6 always contain the crystalline phase detected by X-ray diffractometry, although low in resistivity at $2.5 \times 10^{-4}$ to $5.6 \times 10^{-4}$ Ω·cm. FIGS. 3 and 4 show an X-ray pattern and atomic force microscopic image of the film prepared in COMPARATIVE EXAMPLE 3, respectively, where the film contained both amorphous and crystalline phases. FIGS. 5 and 6 show an X-ray pattern and atomic force microscopic image of the film prepared in COMPARATIVE EXAMPLE 5, respectively, where the film was composed of the crystalline phases. X-ray diffractometry detected a large peak at one of 22, 31, 35, 37, 46, 52 or 56° as 2θ.

These films had a notably higher average centerline roughness (Ra) of 5.3 nm or more than those of the present invention, prepared in EXAMPLES 1 to 22. They had also a high resistivity, and contained a fine crystalline phase, even when prepared by sputtering without heating the substrate. They were composed of a mixture of an amorphous and crystalline phase.

These films were measured for their etching characteristics with a weakly acidic etchant under the same conditions as those for the EXAMPLES. It was found that they tended to leave etching-caused residue of the crystalline phase, and were etched at a lower rate, taking 1.5 to 2 times longer time than those prepared in the EXAMPLES.

These results indicate that it is necessary to grind these films to remove surface roughness when they are to be used for transparent electrodes for LCD and organic EL devices.

Examples 43 to 70

A $In_2O_3$—W—Ge-based, sintered target, comprising indium oxide as the major component and tungsten and germanium was prepared by the following procedure, where the W/In and Ge/In atomic ratios in the target was varied at levels given in Table 5. The starting powder comprised powdered $In_2O_3$, $WO_3$ and $GeO_2$, each having an average particle size of 1 μm or less.

A mixture of given quantities of powdered $In_2O_3$, $WO_3$ and $GeO_2$ was ball-milled in a resin pot with water and balls of hard $ZrO_2$ for 20 hours. The resulting mixed slurry was filtered, dried and granulated. The granules were molded in a mold by cold isostatic pressing at 3 tons/cm$^2$ into an intended shape.

Next, the above molded article was held at 1200° C. for 5 hours in a sintering furnace in an oxygen atmosphere flowing at 5 L/minute per 0.1 m$^3$ of the furnace inside volume, where it was heated at 1° C./minute up to 1000° C. and at 3° C./minute from 1000 to 1200° C. Then, the oxygen flow was stopped, and the resulting sinter was allowed to cool at 10° C./minute from 1200 to 1000° C. Finally, it was held at 1000° C. for 3 hours in an Ar atmosphere flowing at 10 L/minute per 0.1 m$^3$ of the furnace inside volume, and then it was left to stand and cooled to room temperature.

The density of the resulting sinter was determined by the Archimedean method, and converted into relative density based on the theoretical density. The theoretical density was found by dividing the weight of the unit lattice by the volume of the unit lattice, where the former was determined on the assumption that the analyzed quantities of W and Ge were totally dissolved in and substituted for the $In_2O_3$ crystal free of oxygen defects (bixbite type structure) at the In site, and the latter was determined from the lattice constants found by X-ray diffractometry. Each sinter was found to have a relative density of 90% or more. ICP emission spectroscopy results confirmed that the analyzed W and Ge content of the sinter were kept in agreement with those estimated from the charged quantities.

Each sinter was ground by a cup grindstone to have a surface roughness Rmax in a range of 2.2 to 2.7 μm, and cut into a shape, 152 mm in diameter and 5 mm thick, to prepare the sintered target. It was put up on a backing plate of oxygen-free copper via an In-based alloy, to prepare a sputtering target of the $In_2O_3$—W—Ge-based sinter.

The sputtering target was set on a cathode for non-magnetic target in a DC magnetron sputtering apparatus, and the substrate was set in such a way to face the target 60 to 80 mm apart. The substrate was a 1 mm thick synthetic quartz glass. Ar gas (purity: 99.9999% by weight) was passed into the chamber, after it was evacuated to a vacuum degree of $1\times10^{-4}$ Pa or less, to a gas pressure of 0.6 Pa. Oxygen was passed into the Ar gas to 0.5 to 3%, while the chamber was kept at 0.6 Pa. A DC power of 150 to 400 W was applied to the target-substrate space to produce a DC plasma for sputtering, while the substrate was kept at room temperature (about 25° C.) or heated at 300° C. or lower, in order to produce a transparent conductive thin film having a thickness of about 200 nm.

Table 5 shows compositions of each sintered target and transparent conductive thin film prepared by sputtering in the presence of the target, quantitatively determined by ICP emission spectroscopy, together with W/In and Ge/In atomic ratios, and substrate temperature during the film-making process. Moreover, each transparent conductive thin film was measured for its resistivity by the 4-probe method before and after annealing at 180° C. in air, and surface roughness Ra. The results are given in Table 6.

TABLE 5

| EXAMPLE | Target composition (atomic ratio) W/In | Ge/In | Base temperature (° C.) | Film composition (atomic ratio) W/In | Ge/In |
|---|---|---|---|---|---|
| 43 | 0.003 | 0.012 | Room temperature | 0.003 | 0.012 |
| 44 | 0.004 | 0.015 | Room temperature | 0.004 | 0.015 |
| 45 | 0.004 | 0.019 | Room temperature | 0.004 | 0.019 |
| 46 | 0.003 | 0.057 | Room temperature | 0.003 | 0.057 |
| 47 | 0.006 | 0.001 | Room temperature | 0.006 | 0.001 |
| 48 | 0.006 | 0.012 | Room temperature | 0.006 | 0.012 |
| 49 | 0.010 | 0.001 | Room temperature | 0.010 | 0.001 |
| 50 | 0.010 | 0.004 | Room temperature | 0.010 | 0.004 |
| 51 | 0.015 | 0.001 | Room temperature | 0.015 | 0.001 |
| 52 | 0.030 | 0.005 | 120 | 0.030 | 0.005 |
| 53 | 0.030 | 0.010 | 120 | 0.030 | 0.010 |
| 54 | 0.045 | 0.150 | 120 | 0.046 | 0.150 |
| 55 | 0.045 | 0.190 | 120 | 0.047 | 0.190 |
| 56 | 0.006 | 0.041 | 180 | 0.005 | 0.033 |
| 57 | 0.006 | 0.205 | 250 | 0.006 | 0.150 |
| 58 | 0.006 | 0.256 | 300 | 0.005 | 0.186 |
| 59 | 0.012 | 0.042 | 180 | 0.015 | 0.036 |
| 60 | 0.012 | 0.205 | 250 | 0.016 | 0.153 |
| 61 | 0.012 | 0.256 | 300 | 0.015 | 0.188 |
| 62 | 0.020 | 0.041 | 180 | 0.018 | 0.040 |
| 63 | 0.022 | 0.203 | 250 | 0.019 | 0.153 |
| 64 | 0.021 | 0.255 | 300 | 0.018 | 0.188 |
| 65 | 0.025 | 0.041 | 180 | 0.023 | 0.035 |
| 66 | 0.025 | 0.205 | 250 | 0.023 | 0.154 |
| 67 | 0.025 | 0.256 | 300 | 0.022 | 0.189 |
| 68 | 0.032 | 0.041 | 180 | 0.024 | 0.037 |
| 69 | 0.032 | 0.205 | 250 | 0.025 | 0.155 |
| 70 | 0.032 | 0.256 | 300 | 0.026 | 0.190 |

TABLE 6

| EXAMPLE | Film resistivity (Ω · cm) Before annealing | After annealing | Film surface roughness Ra (nm) Before annealing | After annealing |
|---|---|---|---|---|
| 43 | $7.5 \times 10^{-4}$ | $7.8 \times 10^{-4}$ | 0.83 | 0.93 |
| 44 | $5.8 \times 10^{-4}$ | $6.2 \times 10^{-4}$ | 0.89 | 0.95 |
| 45 | $5.5 \times 10^{-4}$ | $5.9 \times 10^{-4}$ | 0.88 | 0.92 |
| 46 | $7.5 \times 10^{-4}$ | $7.9 \times 10^{-4}$ | 0.93 | 0.89 |
| 47 | $2.2 \times 10^{-4}$ | $2.5 \times 10^{-4}$ | 0.94 | 0.98 |

TABLE 6-continued

| EXAMPLE | Film resistivity (Ω·cm) Before annealing | Film resistivity (Ω·cm) After annealing | Film surface roughness Ra (nm) Before annealing | Film surface roughness Ra (nm) After annealing |
|---|---|---|---|---|
| 48 | $3.9 \times 10^{-4}$ | $4.3 \times 10^{-4}$ | 0.92 | 1.02 |
| 49 | $2.8 \times 10^{-4}$ | $3.5 \times 10^{-4}$ | 0.95 | 0.98 |
| 50 | $3.8 \times 10^{-4}$ | $4.2 \times 10^{-4}$ | 0.88 | 0.96 |
| 51 | $4.0 \times 10^{-4}$ | $4.5 \times 10^{-4}$ | 0.80 | 0.96 |
| 52 | $6.5 \times 10^{-4}$ | $7.1 \times 10^{-4}$ | 0.98 | 0.98 |
| 53 | $6.9 \times 10^{-4}$ | $7.3 \times 10^{-4}$ | 1.32 | 1.48 |
| 54 | $7.5 \times 10^{-4}$ | $8.0 \times 10^{-4}$ | 1.32 | 1.43 |
| 55 | $7.3 \times 10^{-4}$ | $7.9 \times 10^{-4}$ | 1.32 | 1.45 |
| 56 | $3.5 \times 10^{-4}$ | $3.7 \times 10^{-4}$ | 0.85 | 0.97 |
| 57 | $3.4 \times 10^{-4}$ | $3.8 \times 10^{-4}$ | 0.93 | 0.97 |
| 58 | $3.6 \times 10^{-4}$ | $3.9 \times 10^{-4}$ | 0.96 | 0.98 |
| 59 | $2.8 \times 10^{-4}$ | $3.2 \times 10^{-4}$ | 0.93 | 0.98 |
| 60 | $3.0 \times 10^{-4}$ | $3.3 \times 10^{-4}$ | 0.96 | 0.94 |
| 61 | $3.1 \times 10^{-4}$ | $3.5 \times 10^{-4}$ | 0.85 | 0.97 |
| 62 | $2.8 \times 10^{-4}$ | $2.9 \times 10^{-4}$ | 0.89 | 0.98 |
| 63 | $3.3 \times 10^{-4}$ | $3.4 \times 10^{-4}$ | 0.85 | 0.92 |
| 64 | $3.2 \times 10^{-4}$ | $3.5 \times 10^{-4}$ | 0.86 | 0.94 |
| 65 | $3.2 \times 10^{-4}$ | $3.5 \times 10^{-4}$ | 0.96 | 0.96 |
| 66 | $3.3 \times 10^{-4}$ | $3.4 \times 10^{-4}$ | 0.89 | 0.99 |
| 67 | $3.5 \times 10^{-4}$ | $3.6 \times 10^{-4}$ | 0.87 | 0.94 |
| 68 | $3.3 \times 10^{-4}$ | $3.9 \times 10^{-4}$ | 0.84 | 0.93 |
| 69 | $3.4 \times 10^{-4}$ | $3.8 \times 10^{-4}$ | 0.89 | 0.98 |
| 70 | $3.5 \times 10^{-4}$ | $4.0 \times 10^{-4}$ | 0.83 | 0.98 |

Comparative Examples 7 to 14

Thin, transparent, electroconductive films were prepared, which comprised $In_2O_3$ doped only with W or Ge, or doped with W and Ge simultaneously but at a W/In and Ge/In atomic ratio out of the range for the present invention. In other words, the sintered target containing W or Ge at a varying W/In or Ge/In atomic ratio was prepared (Table 7) in the same manner as in EXAMPLES. ICP emission spectroscopy results confirmed that the analyzed W and Ge content of the sinter were kept in agreement with those estimated from the charged quantities. Next, each sinter was formed into the sputtering target also in the same manner. The transparent conductive thin film having a thickness of about 200 nm was prepared with the above target on the same substrate under the same conditions as in EXAMPLES.

These sintered targets and sputtering-prepared transparent conductive thin films prepared in COMPARATIVE EXAMPLES 7 to 14 were similarly measured for their compositions, and the resultant transparent conductive thin films for their resistivity and surface roughness Ra. Table 7 gives compositions and substrate temperature during the sputtering process for the sintered targets and transparent conductive thin films, and Table 8 gives resistivity and surface roughness Ra of the resulting transparent conductive thin films.

TABLE 7

| COMPARATIVE EXAMPLE | Target composition (atomic ratio) W/In | Target composition (atomic ratio) Ge/In | Base temperature (° C.) | Film composition (atomic ratio) W/In | Film composition (atomic ratio) Ge/In |
|---|---|---|---|---|---|
| 7 | — | 0.041 | Room temperature | — | 0.035 |
| 8 | — | 0.076 | Room temperature | — | 0.062 |
| 9 | — | 0.205 | Room temperature | — | 0.157 |
| 10 | — | 0.256 | Room temperature | — | 0.190 |
| 11 | — | 0.041 | 180 | — | 0.037 |
| 12 | — | 0.256 | 300 | — | 0.201 |
| 13 | 0.002 | 0.001 | Room temperature | 0.002 | 0.100 |
| 14 | 0.003 | — | Room temperature | 0.003 | — |

TABLE 8

| COMPARATIVE EXAMPLE | Film resistivity (Ω·cm) Before annealing | Film resistivity (Ω·cm) After annealing | Film surface roughness Before annealing | Film surface roughness After annealing |
|---|---|---|---|---|
| 7 | $8.5 \times 10^{-4}$ | $1.3 \times 10^{-3}$ | 1.65 | 1.98 |
| 8 | $7.5 \times 10^{-4}$ | $9.1 \times 10^{-4}$ | 1.75 | 1.99 |
| 9 | $6.3 \times 10^{-4}$ | $7.9 \times 10^{-4}$ | 2.41 | 2.56 |
| 10 | $5.9 \times 10^{-4}$ | $9.3 \times 10^{-4}$ | 2.65 | 2.98 |
| 11 | $5.1 \times 10^{-4}$ | $7.5 \times 10^{-4}$ | 1.54 | 2.03 |
| 12 | $4.9 \times 10^{-4}$ | $5.5 \times 10^{-4}$ | 1.75 | 1.99 |
| 13 | $8.5 \times 10^{-4}$ | $9.6 \times 10^{-4}$ | 3.50 | 4.10 |
| 14 | $8.7 \times 10^{-4}$ | $9.5 \times 10^{-4}$ | 2.70 | 3.50 |

As shown in Tables 5 and 6, each of the transparent conductive thin films of the present invention contained W and Ge at a W/In and Ge/In atomic ratio of 0.003 to 0.047 and 0.001 to 0.190, respectively. Each of the films formed on the substrate kept at room temperature (those prepared in EXAMPLES 43 to 51) had a low resistivity of $8.0 \times 10^{-4}$ Ω·cm or less, amorphous structure as confirmed by X-ray diffractometry, and surface roughness Ra of 1.0 nm or less determined by atomic force microscopy. These films had the characteristics essentially remaining unchanged even when exposed to an annealing heat of 180° C.

Each of the transparent conductive thin films formed on the substrate kept at 150 to 300° C. (those prepared in EXAMPLES 52 to 70) also had a low resistivity of $8.0 \times 10^{-4}$ Ω·cm or less, amorphous structure as confirmed by X-ray diffractometry, and surface roughness Ra of 1.5 nm or less determined by atomic force microscopy. Particularly noted were the films formed on the substrate kept at 180 to 300° C. (those prepared in EXAMPLES 56 to 70) had a low resistivity of $4.0 \times 10^{-4}$ Ω·cm or less, while keeping good surface smoothness. All of these films had the characteristics essentially remaining unchanged even when exposed to an annealing heat of 180° C.

On the other hand, the transparent conductive thin films prepared in COMPARATIVE EXAMPLES 7 to 14, which were free of W or Ge, or contained W and Ge simultaneously but at a W/In and Ge/In atomic ratio out of the range for the present invention, had a surface roughness of 1.5 nm or more. Moreover, their characteristics were greatly changed by annealing heat of 180° C. Those prepared in COMPARATIVE EXAMPLES 8 to 12 had a greatly increased resistivity when exposed to an annealing heat of 180° C., although it was $8.0 \times 10^{-4}$ Ωcm or less before annealing.

The light transmittance of the transparent conductive thin films of the present invention was determined by spectrophotometry. As a result, they were found to have an average visible rays transmittance of 89 to 91%. A thin film of $In_2O_3$—ZnO containing ZnO at 10% by weight was prepared separately in the same manner as in the EXAMPLES on the same substrate to the same thickness, and its light transmittance was compared with that of the film of the present invention. The transparent conductive thin films of the present invention were found to have an apparently higher transmittance in the short wavelength region (e.g., 400 nm) of visible rays than the $In_2O_3$ ZnO-based one.

The transparent conductive thin film was prepared in the same manner as in the EXAMPLES, except that substrate was replaced by a polyether sulfone (PES) film coated with 1 μm thick acrylic-based hard coat layer (total thickness: 0.2 mm), which was further coated with a 50 nm thick silicon oxynitride film. Each of the transparent conductive thin films formed on the substrate, which also fall into the scope of the present invention, was confirmed to have almost the same characteristics as those of prepared in EXAMPLES 43 to 55 having the same composition.

Comparative Example 15

A thin film, about 200 nm thick, was prepared in the same manner as in the EXAMPLES on the same, except that the target was replaced by a sintered target of $In_2O_3$ doped with 5% by weight of $SnO_2$ (ITO), which has been used for the conventional target. The sintered ITO had a relative density of 98% and Sn content, determined by emission spectroscopy, in agreement with that estimated from the charged quantity for preparing the starting powder mixture. The ITO-based, transparent conductive thin film had a much higher resistivity of $8.5 \times 10^{-4}$ Ω·cm than the transparent conductive thin film of the present invention. It was amorphous, but, when annealed in air at 180° C., had a resistivity greatly decreased to $3.5 \times 10^{-4}$ Ω·cm, and it transformed into a crystalline phase to have much rougher surface.

Examples 71 to 75

The $In_2O_3$—W—Ge-based sinter containing W and Ge at a W/In and Ge/In atomic ratio of 0.032 and 0.205 was prepared, and ground by a varying cup grindstone to prepare the sintered target having a varying surface roughness Rmax of 1.5 to 4.9.

Each of the targets prepared in EXAMPLES 71 to 75 was set on a cathode for the non-magnetic target in a DC magnetron sputtering apparatus, as was the case with the one for EXAMPLES 43 to 70. The transparent conductive thin film was prepared by continuous sputtering in the presence of a DC plasma with each target following the procedure similar to those for EXAMPLES 43 to 70 under the film-making conditions of target-substrate distance: 60 mm, Ar gas purity: 99.9999% by weight, gas pressure: 0.5 Pa, and DC power used: 500 W.

The cumulative power consumed for the continuous sputtering process until an arcing phenomenon was observed, and the maximum erosion depth (depth from the plane opposite to the sputtered plane) when the arcing was started was measured. The observations were used to establish the relationship between the surface roughness Rmax and arcing conditions. The results are given in Table 9.

TABLE 9

| | Surface roughness Rmax of the sputtered target surface (μm) | Maximum erosion depth when the arcing was started (mm) |
|---|---|---|
| EXAMPLE | | |
| 71 | 1.5 | Not observed during the testing period |
| 72 | 2.0 | Not observed during the testing period |
| 73 | 2.1 | Not observed during the testing period |
| 74 | 2.5 | Not observed during the testing period |
| 75 | 2.9 | Not observed during the testing period |
| COMPARATIVE EXAMPLE | | |
| 16 | 3.3 | Arcing started at 4.5 mm |
| 17 | 3.6 | Arcing started at 3.7 mm |
| 18 | 4.3 | Arcing started at 2.6 mm |
| 19 | 4.9 | Arcing started at 1.8 mm |

As shown in Table 9, the sintered targets of EXAMPLES 71 to 75 showed neither arcing nor black-colored projections thereon throughout the continuous sputtering process, even when cumulative power increased. Therefore, each of these targets was serviceable throughout the testing period. The film-making rate and film characteristic test results indicated that each of the targets of EXAMPLES 71 to 75 kept the initial characteristics even when cumulative power increased, showing a desirable low resistivity and high transmittance throughout the testing period. The transparent conductive thin film prepared with any of the sintered targets prepared in EXAMPLES 71 to 75 following the procedure similar to those for EXAMPLES 43 to 70 showed constant, excellent characteristics throughout the testing period, irrespective of film-making time and cumulative power consumed. The same trend was observed with the sintered targets containing W and Ge at a W/In and Ge/In atomic ratio of 0.003 to 0.045 and 0.001 to 0.256, respectively.

Comparative Examples 16 to 19

On the other hand, the continuous sputtering was carried out in these examples in the same manner as in EXAMPLES 71 to 75, except that the sintered target had a surface roughness Rmax on the sputtered plane exceeding 2.9. Arcing was observed with each target as cumulative power increased to massively produce black projections on the surface, as shown in Table 9. The film prepared after the arcing phenomenon was notably observed having a resistivity and visible light transmittance greatly deteriorated as compared with that prepared before the phenomenon was not observed. Therefore, the deteriorated sinter could not be used as it was. An organic EL device with the electrode of the transparent conductive thin film prepared after arcing was massively observed showing notably deteriorated luminance.

Example 76

The organic EL device of the present invention was prepared by the following procedure. It had a laminate of thin In—W—Si—O-based and Mg—Ag-based films for the cathode, and chromium for the anode. A 200 nm thick Cr film was formed on a glass substrate by DC sputtering with a Cr target having a diameter of 6 inches under the conditions of sputtering gas: Ar, pressure: 0.4 Pa and DC power: 300 W. The Cr film was patterned by the common lithography technique, to have the anode of a given shape thereon.

Next, the glass substrate coated with the Cr anode was further coated with a 200 nm thick electrically insulating layer of silicon dioxide ($SiO_2$) by oxygen-reactive sputtering with a Si target. This insulating layer on the Cr anode was bored by the common lithography technique. $SiO_2$ was etched with a mixed solution of fluorine and ammonium fluoride. It may be treated by dry etching.

The glass substrate was further coated with an organic layer and thin metallic film by evaporation in a vacuum evaporation apparatus. The organic layer was composed of a hole-injecting layer of 4,4',4"-tris(3-methylphenylamino) triphenylamine (MTDATA), hole-transferring layer of bis (N-naphthyl)-N-phenylbenzidine (α-NPD) and light-emitting layer of 8-quinolinol/aluminum complex (Alq). The thin metallic film formed as the cathode on the organic layer was of a magnesium/silver alloy (Mg:Ag).

Each of the materials for the organic layer (0.2 g), and magnesium (0.1 g) and silver (0.4 g) for the metallic layer, put in a boat for resistance heating, was set on a given electrode in a vacuum evaporation apparatus. A voltage was applied to each boat, after the vacuum chamber was evacuated to $1.0 \times 10^{-4}$ Pa, to heat them one by one. The glass substrate was masked with a metal during the evaporation process in such a way that it was coated with the organic layer and metallic layer of Mg:Ag on given portions, i.e., the portions where chromium was exposed on the substrate. The evaporation mask was designed in such a way to cover the Cr-exposed portions totally and insulating layer edges partially, because it is difficult to form the organic layer and metallic film precisely by evaporation selectively on the Cr-exposed portions.

The glass substrate was first coated with a 30 nm thick MTDATA layer as the hole-injecting layer, 20 nm thick α-NPD layer as the hole-transferring layer, and 50 nm thick Alq layer as the light-emitting layer one by one in this order to form the organic layer. It was then coated with a 10 nm thick metallic layer of Mg:Ag as the cathode on the organic layer by co-evaporation of magnesium and silver. Magnesium was made into the film at a rate 9 times higher than silver.

The coated substrate was further coated with a transparent conductive thin film via the same mask in another vacuum chamber by DC sputtering. In this case, the In—W—Si—O-based, transparent conductive thin film, equivalent with that of EXAMPLE 23, was formed to a thickness of 200 nm under the film-making conditions of sputtering gas: argon/oxygen mixture ($Ar/O_2$ ratio: 99/1 by volume), pressure: 0.6 Pa and DC power: 160 W. The transparent conductive thin film thus prepared showed good electroconductivity and transmission characteristics, although prepared at room temperature.

Finally, a 200 nm thick $SiO_2$ layer as a protective layer was provided by sputtering in such a way to totally cover the transparent, electroconductive film surface. This completed production of the organic EL device. It had a total of 16 image elements (8 by 2) placed at intervals of 2 mm, with 2 cathodes of equilibrium stripe type and 8 anodes of equilibrium stripe type crossing each other to form the 16 elements, 2 by 2 mm in size.

A DC voltage was applied to the organic EL device in an $N_2$ atmosphere to continuously drive it at a constant current density of 10 mA/cm$^2$, in order to follow the average initial luminance, the number of current leaks between the electrodes, the half life of light emission, and whether dark spots were observed or not for 200 hours after light emission was started for 160 image elements, which corresponded to the elements of 10 devices. The results are given in Table 10.

Example 77

An organic EL device with 16 image elements was prepared in the same manner as in EXAMPLE 76, except that the transparent, electroconductive layer for the cathode was replaced by the In—W—Si—O-based, thin, transparent, electroconductive layer, equivalent to that of EXAMPLE 25. The device was similarly analyzed for average initial luminance, number of current leaks between the electrodes, half life of light emission, and whether dark spots were observed or not for 200 hours after light emission was started for 160 image elements, which corresponded to the elements of 10 devices. The results are given in Table 10.

Example 78

An organic EL device with 16 image elements was prepared in the same manner as in EXAMPLE 76, except that the transparent, electroconductive layer for the cathode was replaced by the In—W—Si—O-based, thin, transparent, electroconductive layer, equivalent to that of EXAMPLE 34. The device was similarly analyzed for average initial luminance, number of current leaks between the electrodes, half life of light emission, and whether dark spots were observed or not for 200 hours after light emission was started for 160 image elements, which corresponded to the elements of 10 devices. The results are given in Table 10.

Example 79

An organic EL device with 16 image elements was prepared in the same manner as in EXAMPLE 76, except that the transparent, electroconductive layer for the cathode was replaced by the In—W—Si—O-based, thin, transparent, electroconductive layer, equivalent to that of EXAMPLE 38. The device was similarly analyzed for average initial luminance, number of current leaks between the electrodes, half life of light emission, and whether dark spots were observed or not for 200 hours after light emission was started for 160 image elements, which corresponded to the elements of 10 devices. The results are given in Table 10.

Comparative Example 20

An organic EL device with 16 image elements was prepared in the same manner as in EXAMPLE 76, except that the transparent, electroconductive layer for the cathode was replaced by the In—O-based, thin, transparent, electroconductive layer, equivalent to that of COMPARATIVE EXAMPLE 1. The device was similarly analyzed for average initial luminance, number of current leaks between the electrodes, half life of light emission, and whether dark spots were observed or not for 200 hours after light emission was started for 160 image elements, which corresponded to the elements of 10 devices. The results are given in Table 10.

Comparative Example 21

An organic EL device with 16 image elements was prepared in the same manner as in EXAMPLE 76, except that the transparent, electroconductive layer for the cathode was replaced by the In—Sn—O-based, thin, transparent, electroconductive layer, equivalent to that of COMPARATIVE EXAMPLE 3. The device was similarly analyzed for average initial luminance, number of current leaks between the electrodes, half life of light emission, and whether dark spots (from which no light was emitted) were observed or not for 200 hours after light emission was started for 160 image elements, which corresponded to the elements of 10 devices. The results are given in Table 10.

Comparative Example 22

An organic EL device with 16 image elements was prepared in the same manner as in EXAMPLE 76, except that the transparent, electroconductive layer for the cathode was replaced by an In—Zn—O-based, thin, transparent, electroconductive layer, which was prepared by DC sputtering with a sintered target of $In_2O_3$—ZnO (10% by weight) at a film-making temperature of room temperature. The device was similarly analyzed for average initial luminance, number of current leaks between the electrodes, half life of light emission, and whether dark spots (from which no light was emitted) were observed or not for 200 hours after light emission was started for 160 image elements, which corresponded to the elements of 10 devices. The results are given in Table 10.

TABLE 10

| | Average luminance | Half life of luminance | Dark spot |
|---|---|---|---|
| EXAMPLE | | | |
| 76 | 440 cd/m² | 800 h | Not observed |
| 77 | 430 cd/m² | 800 h | Not observed |
| 78 | 450 cd/m² | 800 h | Not observed |
| 79 | 480 cd/m² | 800 h | Not observed |
| COMPARATIVE EXAMPLE | | | |
| 20 | 310 cd/m² | 400 h | A total of 35 spots observed per 10 mm square |
| 21 | 340 cd/m² | 300 h | A total of 21 spots observed per 10 mm square |
| 22 | 350 cd/m² | 750 h | Not observed |

As shown in Table 10, each of the organic EL devices prepared in EXAMPLES 76 to 79 with the transparent conductive thin film of the present invention as the cathode had a higher average initial luminance and apparently longer half life of luminance than any of the organic EL devices prepared in COMPARATIVE EXAMPLES 20 to 22 using the conventional materials. It was confirmed to have a luminance of 400 cd/m² or more, and a half life of luminance of 800 hours. A number of dark spots (from which no light was emitted) were observed in each of the organic EL devices prepared in COMPARATIVE EXAMPLES 20 to 22 using the conventional materials for 200 hours after it started light emission. By contrast, each of the organic EL devices prepared in EXAMPLES 76 to 79 with the transparent conductive thin film of the present invention as the cathode showed no dark spots in the same period. The organic EL device prepared in COMPARATIVE EXAMPLE 22 showed no dark spots (from which no light was emitted) for 200 hours after it started light emission and a half life of luminance as long as those of the devices prepared in EXAMPLES 76 to 79, but it showed a lower initial luminance.

It is clarified that the thin In—Zn—O film used as the cathode is inferior to the single, transparent conductive thin film of the present invention in light transmittance by the comparison test for light transmittance. This will account for lower luminance of the conventional device. The XPS analysis of the thin In—Zn—O film clarified that it contained metallic Zn, which is judged to be responsible for the lower transmittance than that of the film of the present invention at around 400 nm.

These organic EL devices prepared in the examples were tested for their light-emitting characteristics in a similar manner after they were exposed to an atmosphere of 95% RH and 80° C. for 100 hours. It was found by these tests that the devices prepared in COMPARATIVE EXAMPLES 21 and 22 showed a number of dark spots in the very initial stage of light emission, whereas the organic EL devices prepared in EXAMPLES 76 to 79 showed no dark spots even for 200 hours after light emission was started, resulting from the high heat resistance of the transparent conductive thin film of the present invention.

Exactly the same tendency was observed with the devices that included the cathode of the In—W—Si—O-based amorphous thin film having the composition prepared in each of EXAMPLE 24, EXAMPLES 26 to 33, EXAMPLES 35 to 37, and EXAMPLES 39 to 42 with the substrate kept at room temperature to 100° C. Therefore, these thin films of the present invention can make organic EL devices excellent in light-emitting characteristics, heat resistance and moisture resistance, and showing no dark spots.

An active matrix type organic EL device was prepared in a manner similar to that for EXAMPLE 76 using a glass substrate provided with a thin-film transistor and its circuit. It showed exactly the same results as the above. Therefore, it can make an organic EL device excellent in light-emitting characteristics, heat resistance and moisture resistance, and showing no dark spots.

Example 80

An organic EL device of the same structure was prepared in the same manner as in EXAMPLE 76, except that the chromium anode, used for those prepared in EXAMPLES 76 to 79, was replaced by a palladium anode. It showed as excellent light-emitting characteristics as those prepared in EXAMPLES 76 to 79 using the Cr anode, and no dark spots even for 200 hours after light emission was started.

Example 81

Organic EL devices of the same structure were prepared in the same manner as in EXAMPLE 76, except that the cathode of the In—W—Si—O-based, amorphous, thin film, used for those prepared in EXAMPLES 76 to 79, was replaced by that of the In—Si—O-based, amorphous, thin film prepared in one of EXAMPLES 1 to 6 or that of the In—Sn—Si—O-based, amorphous, thin film prepared in one of EXAMPLES 7 to 22 with the substrate kept at room temperature to 300° C.

These organic EL devices showed as excellent light-emitting characteristics as those prepared in EXAMPLES 76 to 79 using the cathode of the In—W—Si—O-based, amorphous, transparent conductive thin film, and no dark spots, even for 200 hours after light emission was started.

Example 82

Organic EL devices of the structure shown in FIG. 7 were prepared in the same manner as in EXAMPLE 76, except that the metallic anode, used for those prepared in EXAMPLES 76 to 79, was replaced by that of the In—Si—O-based, In—Sn—Si—O-based or In—W—Si—O-based, amorphous, thin film prepared in one of EXAMPLES 1 to 42 with the substrate kept at room temperature to 300° C.

These organic EL devices could emit light not only from the cathode but also from the anode. Their light-emitting characteristics were analyzed. They showed as excellent light-emitting characteristics as those prepared in EXAMPLES, and no dark spots even for 200 hours after light emission was started. However, the similar organic EL devices with the anode of In—Si—O-based or In—Sn—O-based thin film prepared in one of COMPARATIVE EXAMPLES 1 to 6 showed a number of dark spots for 200 hours after light emission was started.

Example 83

Organic EL devices of the structure shown in FIG. 7 were prepared on a substrate of polyether sulfone (PES) film coated with a 1 μm thick acrylic-based hard coat layer (total thickness: 0.2 mm), which was further coated with a 50 nm thick silicon oxynitride film.

They had an anode and cathode of the In—Si—O-based, In—Sn—Si—O-based or In—W—Si—O-based, amorphous, transparent conductive thin film prepared in one of EXAMPLES 1 to 42 with the substrate kept at room temperature to 120° C. They showed good light-emitting characteristics.

A transparent conductive thin film of silicon-doped indium oxide was formed on a glass substrate by RF sputtering under the following film-making conditions. The resulting thin film, although having a resistivity of $7.5 \times 10^{-4}$ Ω·cm, was a transparent, crystalline, electroconductive film of very poor surface smoothness, having a number of X-ray diffraction peaks and surface roughness Ra of 5.7 nm.

Film-making Conditions

Target composition: $In_2O_3 + SiO_2$ (2% by weight), target size: 6 inches in diameter, gas pressure: 0.2 Pa, sputtering gas: pure Ar, target-substrate distance: 40 mm, RF power: 500 W, and the substrate not heated An organic EL device of the structure shown in FIG. 7 was prepared in the same manner as in EXAMPLE 76, except that the anode was replaced by the one of the thin, In—Si—O-based film prepared in COMPARATIVE EXAMPLE 23. It showed a number of dark spots for 200 hours after light emission were started.

Examples 84 to 87

The organic EL devices of the present invention were prepared by the following procedure to have a laminate of thin In—W—Ge—O-based and Mg—Ag-based films for the cathode, and chromium having a work function of 4.5 eV for the anode. A 200 nm thick Cr film was formed on a glass substrate by DC sputtering with a Cr target having a diameter of 6 inches under the conditions of sputtering gas: Ar, pressure: 0.4 Pa and DC power: 300 W. The Cr film was patterned by the common lithography technique, to have the anode of a given shape thereon.

Next, the glass substrate coated with the Cr anode was further coated with a 200 nm thick electrically insulating layer of silicon dioxide ($SiO_2$) by oxygen-reactive sputtering with a Si target. This insulating layer on the Cr anode was bored by the common lithography technique. $SiO_2$ was etched with a mixed solution of fluorine and ammonium fluoride. It may be treated by dry etching.

The glass substrate was further coated with an organic layer and thin metallic film by evaporation in a vacuum evaporation apparatus. The organic layer was composed of a hole-injecting layer of 4,4',4"-tris(3-methylphenylamino) triphenylamine (MTDATA), hole-transferring layer of bis (N-naphthyl)-N-phenylbenzidine (α-NPD) and light-emitting layer of 8-quinolinol/aluminum complex (Alq). The thin metallic film formed as the cathode on the organic layer was of a magnesium/silver alloy (Mg:Ag).

Each of the materials for the organic layer (0.2 g), and magnesium (0.1 g) and silver (0.4 g) for the metallic layer, put in a boat for resistance heating, was set on a given electrode in a vacuum evaporation apparatus. A voltage was applied to each boat, after the vacuum chamber was evacuated to $1.0 \times 10^{-4}$ Pa, to heat them one by one. The glass substrate was masked with a metal during the evaporation process in such a way that it was coated with the organic layer and metallic layer of Mg:Ag on given portions, i.e., the portions where chromium was exposed on the substrate.

For evaporation of the organic layer and thin metallic layer, the glass substrate was first coated with a 30 nm thick MTDATA layer as the hole-injecting layer, 20 nm thick α-NPD layer as the hole-transferring layer, and 50 nm thick Alq layer as the light-emitting layer one by one in this order to form the organic layer. It was then coated with a 10 nm thick thin metallic layer of Mg:Ag as the cathode on the organic layer by co-evaporation of magnesium and silver. Magnesium was made into the film at a rate 9 times higher than silver.

The coated substrate was further coated with a 200 nm thick, transparent conductive thin film via the same mask by DC sputtering in another vacuum chamber, into which the whole coated substrate was transferred, to form the cathode composed of this film and the thin metallic film. The conditions for making the electroconductive film were sputtering gas: argon/oxygen mixture ($Ar/O_2$ ratio:99/1 by volume), pressure:0.6 Pa and DC power: 160 W.

Finally, a 200 nm thick $SiO_2$ layer as a protective layer was provided by sputtering in such a way to totally cover the transparent, electroconductive film surface. This completed production of the organic EL device. The organic EL devices prepared in EXAMPLES 84 to 87 used a transparent conductive thin film having the composition prepared in EXAMPLES 47, 51, 46 and 43, respectively. Each device had a total of 16 image elements (8 by 2) placed at intervals of 2 mm, with 2 cathodes of equilibrium stripe type and 8 anodes of equilibrium stripe type crossing each other to form the 16 elements, 2 by 2 mm in size.

Comparative Examples 25 to 27

An organic EL device of the same structure was prepared in each of these comparative examples in the same manner as in EXAMPLES 84 to 87, except that the transparent conductive thin film was replaced by the thin film prepared in COMPARATIVE EXAMPLES 7 and 9 for COMPARATIVE EXAMPLES 25 and 26, respectively, and by an $In_2O_3$—ZnO-based, transparent conductive thin film (equivalent with that prepared in COMPARATIVE EXAMPLE 22) for COMPARATIVE EXAMPLE 27, where the $In_2O_3$—ZnO-based film was prepared by DC sputtering with a sintered target of $In_2O_3$ doped with 10% by weight of ZnO and a substrate kept at room temperature.

A DC voltage was applied to each organic EL device in an $N_2$ atmosphere to continuously drive it at a constant current density of 10 mA/cm², in order to follow average initial luminance, half life of light emission, and whether dark spots were observed or not for 200 hours after light emission was started for 160 image elements, which corresponded to the elements of 10 devices. The results are given in Table 11.

TABLE 11

|  | Average luminance (cd/m²) | Half life of luminance (hour) | Dark spot |
|---|---|---|---|
| EXAMPLE |  |  |  |
| 84 | 450 | 800 | Not observed |
| 85 | 420 | 800 | Not observed |
| 86 | 400 | 800 | Not observed |
| 87 | 410 | 800 | Not observed |
| COMPARATIVE EXAMPLE |  |  |  |
| 25 | 300 | 600 | A total of 9 spots observed per 10 mm square |
| 26 | 320 | 300 | A total of 23 spots observed per 10 mm square |
| 27 | 350 | 800 | Not observed |

As shown in Table 11, each of the organic EL devices prepared in EXAMPLES 84 to 87 with the transparent conductive thin film of the present invention as the cathode was confirmed to have a higher average initial luminance of 400 cd/m² or more and an apparently longer half life of luminance of 800 hours more than any of the organic EL devices prepared in COMPARATIVE EXAMPLES 25 to 27 using the conventional materials. A number of dark spots (from which no light was emitted) were observed in each of the organic. EL devices prepared in COMPARATIVE EXAMPLES 25 to 27 for 200 hours after it started light emission. By contrast, each of the organic EL devices prepared in EXAMPLES 84 to 87 showed no dark spots in the same period.

The organic EL device prepared in COMPARATIVE EXAMPLE 27, which used and $In_2O_3$—ZnO-based, transparent conductive thin film, showed no dark spots (from which no light was emitted) for 200 hours after it started light emission and a half life of luminance of 800 hours, which was as long as that of the devices of the present invention. However, its initial luminance is only 350 cd/m², much lower than that of the devices of the present invention. The lower luminance conceivably resulted from insufficient light transmittance of the thin, $In_2O_3$—ZnO-based film used for the cathode. The XPS analysis of the thin, $In_2O_3$—ZnO-based film clarified that it contained metallic Zn, which is judged to be responsible for the much lower transmittance than that of the film of the present invention at around 400 nm.

The organic EL devices prepared in these examples were tested for their light-emitting characteristics in a similar manner after they were exposed to an atmosphere of 95% RH and 80° C. for 100 hours. It was found by these tests that the devices prepared in COMPARATIVE EXAMPLES 25 to 27 showed a number of dark spots in the very initial stage of light emission, whereas those prepared in EXAMPLES 84 to 87 showed no dark spots even for 200 hours after light emission was started. This means that the transparent conductive thin films of the present invention are also excellent in heat resistance.

An organic EL device of the same structure was prepared in the same manner as in EXAMPLES 84 to 87, except that the substrate was replaced by a glass substrate provided with a thin-film transistor and its circuit. It showed excellent light-emitting characteristics, like those prepared in EXAMPLES 84 to 87. It showed no dark spots even for 200 hours after light emission was started.

Examples 88 to 91

Organic EL devices of the same structure were prepared in the same manner as in EXAMPLES 84 to 87, except that the chromium (Cr) anode was replaced by a palladium (Pd) anode and the cathode of thin Mg—Ag alloy film was replaced by a cathode composed only of the transparent conductive thin film of the present invention. These organic EL devices with the Pd anode showed as excellent light-emitting characteristics as those with the Cr anode, prepared in EXAMPLES 84 to 87 with the Cr anode, and no dark spots even for 200 hours after light emission was started.

Organic EL devices of the same structure were also prepared in the same manner as in EXAMPLES 84 to 87, except that the anode of Cr was replaced by that of a transparent conductive thin film having the composition equivalent with that prepared in one of EXAMPLES 52 to 70. These organic EL devices could emit light not only from the cathode but also from the anode. Their light-emitting characteristics were analyzed. They showed as excellent light-emitting characteristics as those prepared in EXAMPLES 84 to 87, and no dark spots even for 200 hours after light emission was started. However, the similar organic EL devices with the anode of $In_2O_3$—Ge-based or $In_2O_3$—Sn (ITO)-based thin film prepared in one of COMPARATIVE EXAMPLES 7 to 14 showed a number of dark spots for 200 hours after light emission was started.

Organic EL devices of the same structure were prepared, in a manner similar to those for EXAMPLES 84 to 87, on a substrate of polyether sulfone (PES) film coated with 1 μm thick acrylic-based hard coat layer (total thickness: 0.2 mm), which was further coated with a 50 nm thick silicon oxynitride film. They had an anode and cathode of a transparent conductive thin film having the composition equivalent with that prepared in one of EXAMPLES 43 to 51. They showed good light-emitting characteristics.

Advantages of the Invention

As described above in detail, the transparent conductive thin film of the present invention is very excellent in surface smoothness, because it is completely free of any crystalline phase and completely amorphous, and low in resistance and at least as excellent as an indium tin oxide (ITO) film in transmittance of visible rays including the low-wavelength region. This thin film can be easily formed on a substrate by the common sputtering or ion plating method in the presence of the sintered target of the present invention.

Moreover, the transparent conductive thin film and substrate on which the film is formed are very useful for transparent electrodes not only for organic EL devices, which need a transparent electrode of smooth surface and low electrical resistance, but also for inorganic EL devices and display devices, e.g., LCDs. Therefore, the transparent conductive thin film of the present invention is of very high industrial value, because it can give an organic EL device high in luminance, long in half life of luminance, causing no dark spots and high in durability.

What is claimed is:

1. A sintered target for producing the transparent conductive thin film containing indium oxide as the major component and silicon, having a substantially amorphous structure, wherein the sintered target comprises sintered indium oxide doped with silicon and tungsten.

2. A process for producing a thin, amorphous, transparent, electroconductive film comprising silicon-doped indium oxide on a substrate, said process comprising sputtering a substrate in an oxygen-containing inert gas atmosphere in a sputtering apparatus which contains the substrate and sintered target of one of selected from the group consisting of sintered indium oxide doped with silicon and indium oxide doped with silicon together with tin and/or tungsten.

3. The process according to claim 2 for producing a thin, amorphous, transparent, electroconductive film, wherein said substrate is heated at 100 to 300° C.

4. The process according to claim 2 for producing a thin, amorphous, transparent, electroconductive film, wherein said inert gas is a mixture of argon and oxygen containing oxygen at 1% or more.

5. The process according to claim 2 for producing a thin, amorphous, transparent, electroconductive film, wherein said film is produced by DC sputtering in an oxygen-containing inert gas atmosphere after pressure in the sputtering apparatus is set at 0.1 to 1 Pa.

* * * * *